United States Patent
Watanabe et al.

(10) Patent No.: US 9,549,460 B2
(45) Date of Patent: Jan. 17, 2017

(54) PRINTED WIRING BOARD

(71) Applicant: FUJIKURA LTD, Tokyo (JP)

(72) Inventors: Hirohito Watanabe, Sakura (JP); Taiji Ogawa, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/717,456

(22) Filed: May 20, 2015

(65) Prior Publication Data

US 2015/0342030 A1    Nov. 26, 2015

(30) Foreign Application Priority Data

May 21, 2014    (JP) .................................. 2014-105105

(51) Int. Cl.
*H05K 1/00* (2006.01)
*H05K 1/02* (2006.01)
(Continued)

(52) U.S. Cl.
CPC ............ *H05K 1/0216* (2013.01); *H05K 1/025* (2013.01); *H05K 1/0225* (2013.01);
(Continued)

(58) Field of Classification Search
CPC .............. H05K 1/02; H05K 1/14; H05K 1/18; H05K 9/00; H01L 23/12; H01L 23/13; H01L 23/48; H01P 3/02; H01P 3/06; H01P 3/08
(Continued)

(56) References Cited

U.S. PATENT DOCUMENTS 6,444,922 B1 *   9/2002   Kwong .................... H05K 1/14
                                                              174/255
7,145,239 B2 * 12/2006   Li ...................... H01L 23/49822
                                                              257/752
(Continued)

FOREIGN PATENT DOCUMENTS

JP   2000-77802 A    3/2000
JP   2005-175078 A   6/2005
JP   2011-165910 A   8/2011

OTHER PUBLICATIONS

Japanese Office Action for JP 2014-105105 dated Aug. 26, 2014.

*Primary Examiner* — Xiaoliang Chen
(74) *Attorney, Agent, or Firm* — Sughrue Mion, PLLC

(57) ABSTRACT

To suppress occurrence of a difference in transmission time due to a difference in length between signal lines, there is provided a printed wiring board having: an insulating substrate (10); a first signal line (L31A) that constitutes differential signal lines formed on the insulating substrate (10) and includes a curved portion; a second signal line (L31B) provided along the first signal line (L31A) and side by side inside the curved portion; and a ground layer (30) formed for the first signal line (L31A) and the second signal line (L31B) via an insulating material (10). The ground layer (30) includes a first ground layer (G31A) corresponding to a first region (D1) and a second ground layer (G31B) corresponding to a second region (D2). The first region (D1) is defined based on the first signal line (L31A) and has a first predetermined width (W31A). The second region (D2) is defined based on the second signal line (L31B) and has a second predetermined width (W31B). The first ground layer (G31A) has a remaining ratio lower than a remaining ratio of the second ground layer (G31B).

4 Claims, 21 Drawing Sheets

(51) Int. Cl.
*H05K 1/03* (2006.01)
*H01P 3/08* (2006.01)

(52) U.S. Cl.
CPC ......... *H05K 1/0237* (2013.01); *H05K 1/0393* (2013.01); *H01P 3/085* (2013.01); *H05K 2201/0715* (2013.01); *H05K 2201/09027* (2013.01); *H05K 2201/09681* (2013.01); *H05K 2201/09727* (2013.01)

(58) Field of Classification Search
USPC .......... 174/268, 51, 254, 255, 261; 361/748; 257/700, 752, 776; 333/4, 5, 12, 28 R, 333/204, 238
See application file for complete search history.

(56) References Cited

U.S. PATENT DOCUMENTS

| | | | |
|---|---|---|---|
| 8,076,989 B2* | 12/2011 | Peschke | G01R 1/24 333/12 |
| 2001/0010271 A1* | 8/2001 | Lin | H05K 1/0224 174/255 |
| 2002/0060366 A1* | 5/2002 | Kikuchi | H01L 23/13 257/776 |
| 2007/0194434 A1* | 8/2007 | Lin | H01L 23/49822 257/700 |
| 2011/0279189 A1* | 11/2011 | Umeda | H05K 1/0245 333/5 |
| 2012/0032749 A1* | 2/2012 | Shiue | H01P 3/08 333/5 |
| 2013/0038413 A1* | 2/2013 | Wu | H04B 3/14 333/28 R |
| 2013/0252445 A1* | 9/2013 | Barr | H01R 13/6585 439/90 |
| 2014/0241659 A1* | 8/2014 | Fukuda | G02F 1/0121 385/3 |
| 2015/0055307 A1* | 2/2015 | Shaw | H05K 1/0253 361/748 |
| 2015/0327359 A1* | 11/2015 | Tuominen | H05K 1/0253 333/238 |

\* cited by examiner

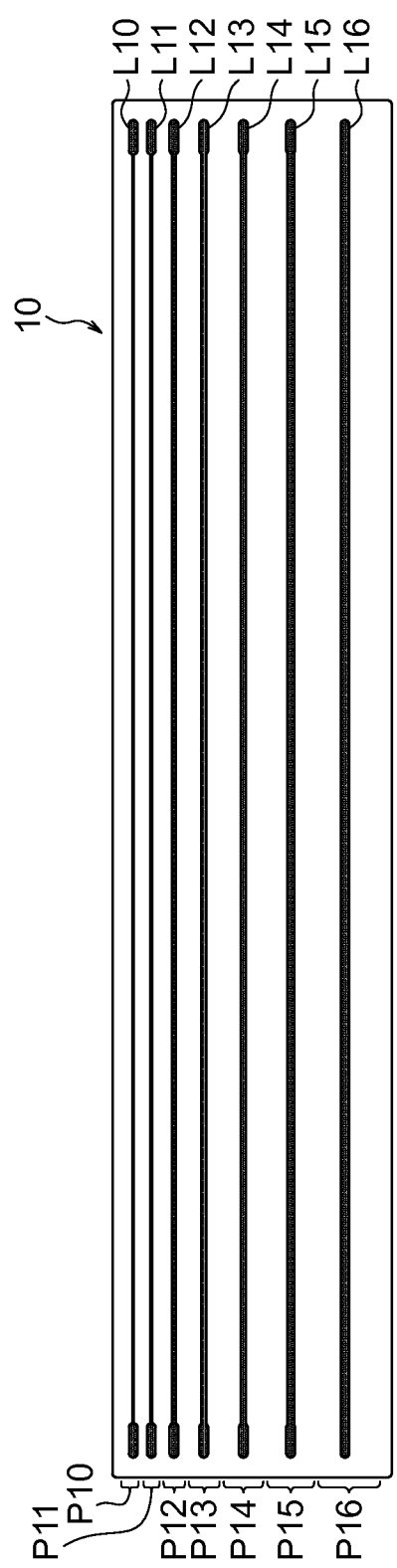

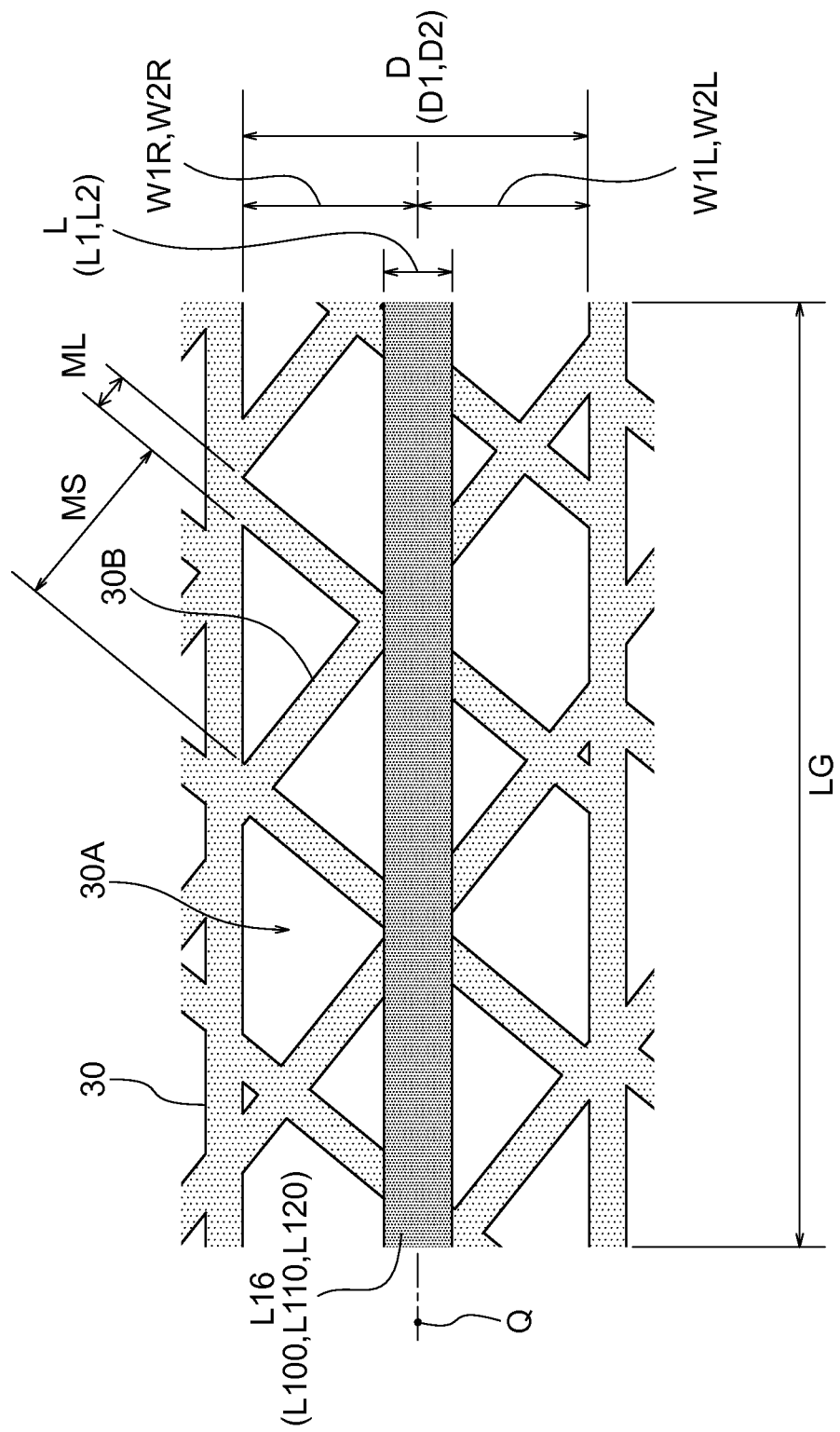

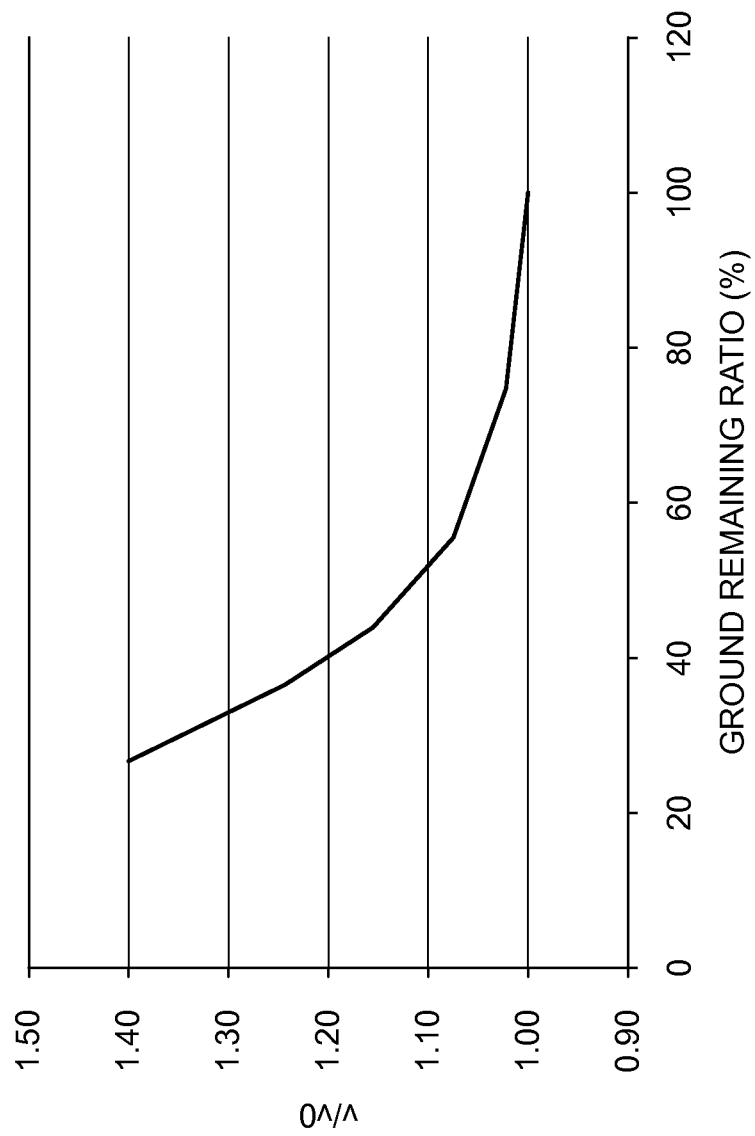

FIG. 5

| MESH DESIGN | | | | V/V0 | | | | | | |
|---|---|---|---|---|---|---|---|---|---|---|
| GROUND LAYER REMAINING RATIO [%] | ML[μm] | MS[μm] | $Z_0$=50Ω SIGNAL LINE CIRCUIT WIDTH L [μm] | GROUND LAYER EXTRACTION WIDTH (REGION WIDTH) [μm] | | | | | | |
| | | | | L×1 | L×2 | L×3 | L×5 | L×7 | L×9 | |
| 100 | 150 | 0 | 80 | 1.000 | 1.000 | 1.000 | 1.000 | 1.000 | 1.000 | |
| 75 | 150 | 150 | 95 | 1.007 | 1.014 | 1.022 | 1.022 | 1.022 | 1.022 | |
| 56 | 150 | 300 | 130 | 1.026 | 1.051 | 1.077 | 1.077 | 1.077 | 1.077 | |
| 44 | 150 | 450 | 190 | 1.053 | 1.105 | 1.158 | 1.158 | 1.158 | 1.158 | |
| 36 | 150 | 600 | 240 | 1.084 | 1.168 | 1.252 | 1.252 | 1.252 | 1.252 | |
| 31 | 150 | 750 | 290 | 1.113 | 1.225 | 1.338 | 1.338 | 1.338 | 1.338 | |
| 27 | 150 | 900 | 350 | 1.134 | 1.268 | 1.403 | 1.403 | 1.403 | 1.403 | |

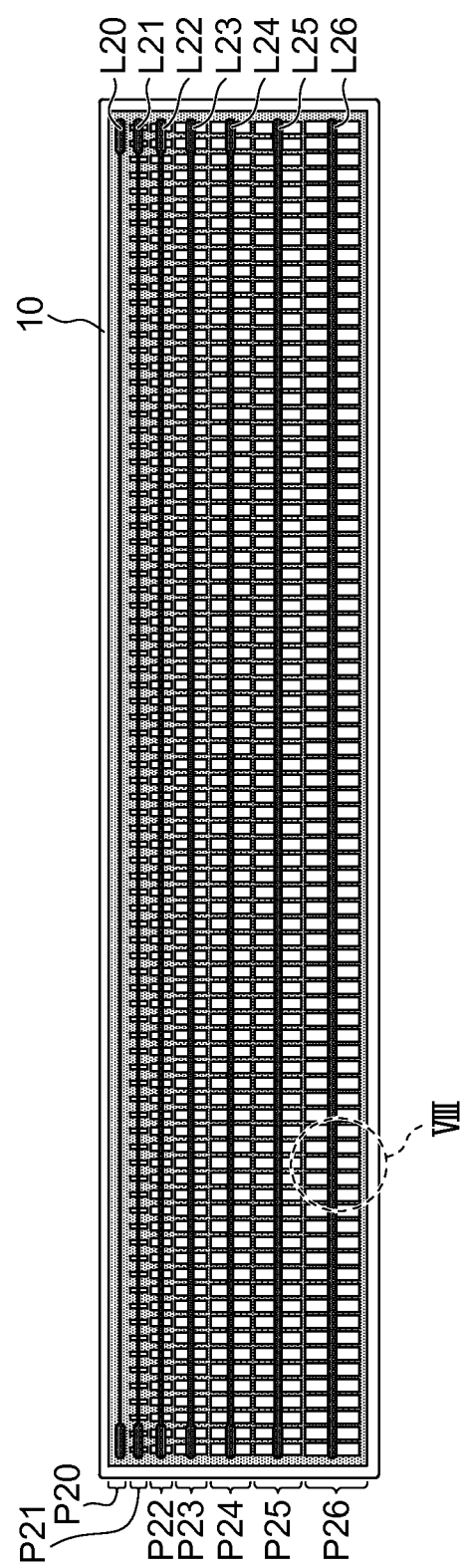

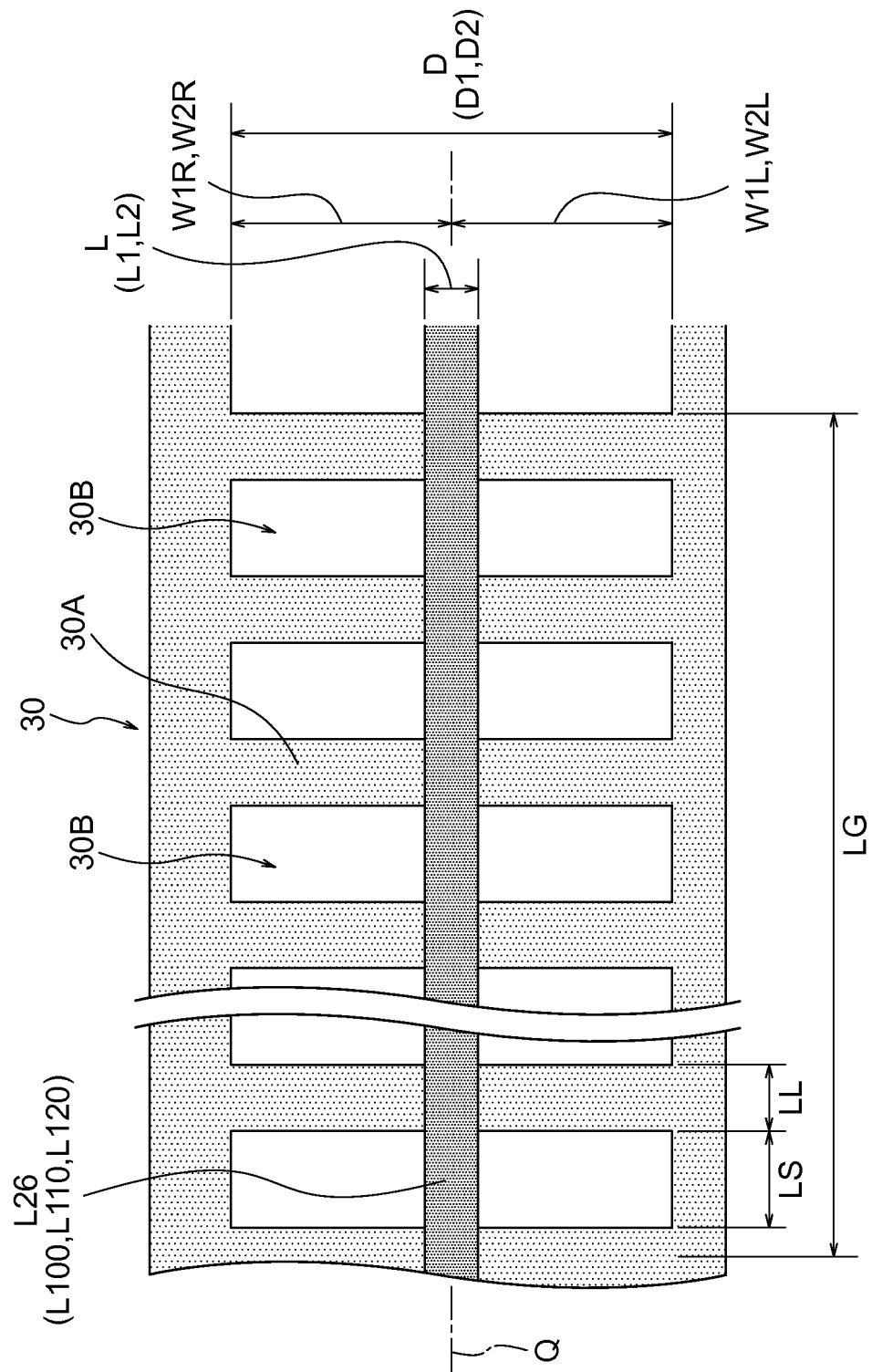

FIG. 9

| MESH DESIGN | | | | V/V0 | | | | | | | |
|---|---|---|---|---|---|---|---|---|---|---|---|
| GROUND LAYER REMAINING RATIO [%] | LL [μm] | LS [μm] | Z₀=50Ω SIGNAL CIRCUIT LINE WIDTH L [μm] | GROUND LAYER EXTRACTION WIDTH (REGION WIDTH) [μm] | | | | | | | |
| | | | | Lx1 | Lx2 | Lx3 | Lx5 | Lx7 | Lx9 | | |
| 100 | 500 | 0 | 75 | 1.000 | 1.000 | 1.000 | 1.000 | 1.000 | 1.000 | | |
| 75 | 375 | 125 | 90 | 1.004 | 1.008 | 1.011 | 1.011 | 1.011 | 1.011 | | |
| 56 | 278 | 222 | 125 | 1.022 | 1.044 | 1.066 | 1.066 | 1.066 | 1.066 | | |
| 44 | 219 | 281 | 185 | 1.049 | 1.098 | 1.146 | 1.146 | 1.146 | 1.146 | | |
| 36 | 180 | 320 | 235 | 1.080 | 1.160 | 1.240 | 1.240 | 1.240 | 1.240 | | |
| 31 | 153 | 347 | 285 | 1.108 | 1.216 | 1.324 | 1.324 | 1.324 | 1.324 | | |
| 27 | 133 | 367 | 345 | 1.130 | 1.259 | 1.389 | 1.389 | 1.389 | 1.389 | | |

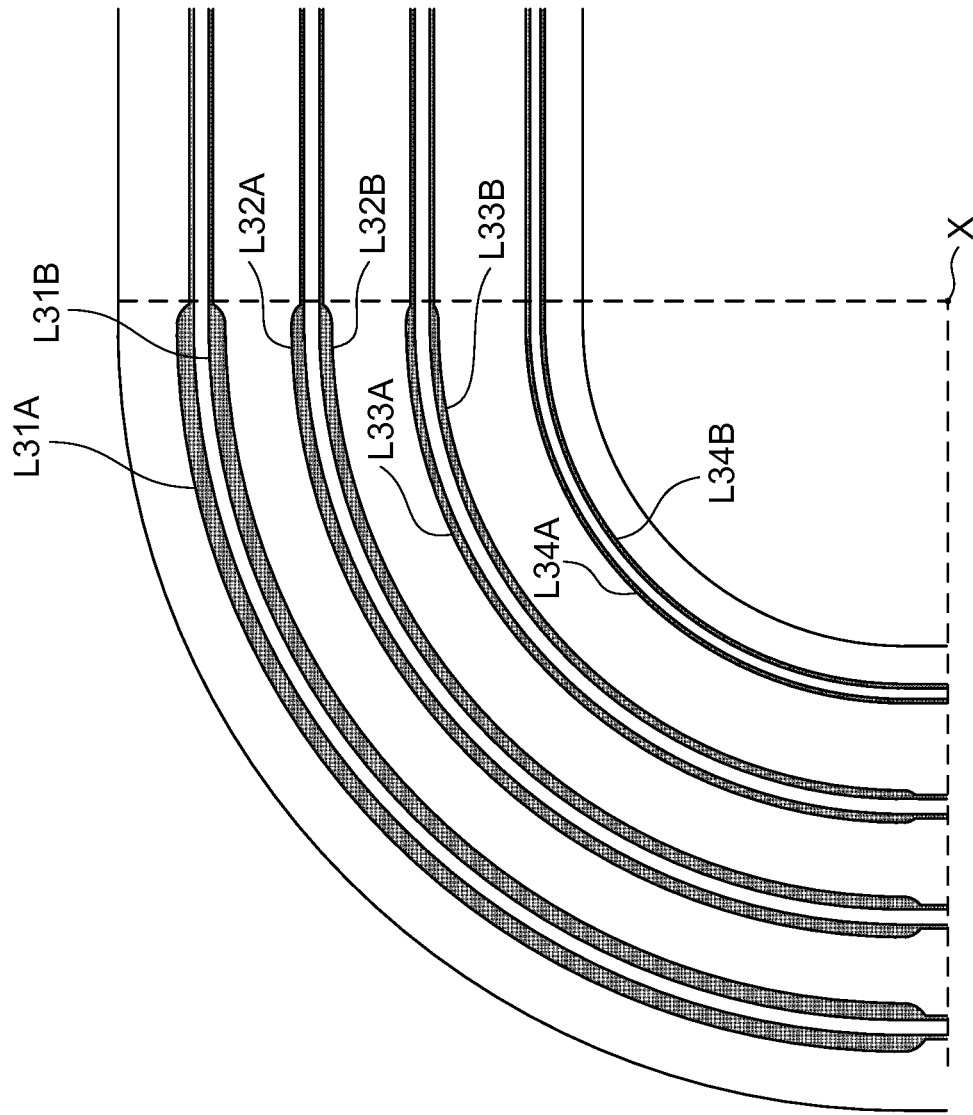

FIG. 14

| DIFFERENTIAL WIRING | SIGNAL LINE | CURVATURE RADIUS [mm] | CIRCUIT WIDTH [μm] | MESH DESIGN | | |
|---|---|---|---|---|---|---|
| | | | | GROUND LAYER REMAINING RATIO [%] | LL[μm] | LS[μm] |
| L34 | L34B | 5 | 80 | 100 | | |
| | L34A | 5.1 | 90 | 79.2 | 529 | 139 |
| L33 | L33B | 6.415 | 152 | 50.7 | 425 | 414 |
| | L33A | 6.6 | 162 | 48.8 | 421 | 443 |
| L32 | L32B | 7.915 | 212 | 39.9 | 413 | 623 |
| | L32A | 8.1 | 218 | 38.9 | 412 | 648 |
| L31 | L31B | 9.415 | 265 | 32.8 | 405 | 828 |
| | L31A | 9.6 | 272 | 32.1 | 403 | 853 | ical signaling, the trans-
PRINTED WIRING BOARD

CROSS REFERENCE TO RELATED APPLICATIONS

This application claims priority based on Japanese Patent Application No. 2014-105105 filed May 21, 2014, the contents of which are incorporated herein by reference in their entirety.

BACKGROUND OF THE INVENTION

1. Field of the Invention

The present invention relates to a printed wiring board.

2. Description of the Related Art

In general, when a difference in length exists between a pair of signal lines used in differential signaling, the transmission quality deteriorates because the transmission time also differs between the signal lines.

As a relevant technique, there has been known a printed wiring board in which conductor vias are formed in the vicinity of signal lines to adjust the difference in delay time of signals (Patent Document 1: JP 2011-165910 A). According to the technique described in Patent Document 1, the conductor vias are provided along straight portions of upstream side and downstream side with respect to curved portions of the signal lines thereby to delay a propagation time of a signal propagating in an inside signal line that is close to the conductor vias at the straight portions of the upstream side and the downstream side with respect to the curved portion, so that the propagation time is allowed to be the same between signals transmitted by the two signal lines.

Patent Document 1: JP 2011-165910 A

SUMMARY OF THE INVENTION

According to the prior art, however, although the difference in propagation time caused between the signal propagating in the signal line inside at the curve and the signal propagating in the signal line outside at the curve can be compensated at the output end side, the difference in transmission speed between the signals cannot be suppressed from occurring at the curved portions of the signal lines. This leads to a problem in that radiation noise is generated to deteriorate the transmission quality.

An object of the present invention is to provide a printed wiring board which suppresses the occurrence of a difference in transmission speed of signals at curved portions of signal lines thereby to achieve high transmission quality.

(1) According to an aspect of the present invention, the above object is achieved by providing a printed wiring board comprising: an insulating substrate; a first signal line that constitutes differential signal lines formed on the insulating substrate and includes a curved portion; a second signal line provided along the first signal line and side by side inside the curved portion; and a ground layer formed for the first signal line and the second signal line via an insulating material. The ground layer includes a first ground layer corresponding to a first region and a second ground layer corresponding to a second region. The first region is defined based on a position of the first signal line and has a first predetermined width. The second region is defined based on a position of the second signal line and has a second predetermined width. The first ground layer has a remaining ratio lower than a remaining ratio of the second ground layer.

(2) In the above invention, the above object is achieved by providing a printed wiring board in which the circuit width of the first signal line is larger than the circuit width of the second signal line.

(3) In the above invention, the above object is achieved by providing a printed wiring board in which the width of the first region is larger than the width of the second region.

(4) In the above invention, the above object is achieved by providing a printed wiring board in which each of the first ground layer and the second ground layer has a mesh structure in which a plurality of partial regions are discretely removed so that a remaining region constitutes the mesh structure.

(5) In the above invention, the remaining ratio of each of the first ground layer and the second ground layer having the mesh structure can be defined by a width of the remaining region and a width of each removed partial region.

According to the present invention, in the differential signal lines, the remaining ratio of the first ground layer corresponding to the first signal line provided outside at the curved portion is lower than the remaining ratio of the second ground layer corresponding to the second signal line provided inside at the curved portion, so that the transmission speed in the first signal line having a relatively long length is relatively fast, or the transmission speed in the second signal line having a relatively short length is relatively slow. This allows input signals to be output without transmission time difference even when the lengths of a pair of signal lines that constitute differential signal lines are different. As a result, a printed wiring board having high transmission quality can be provided.

BRIEF DESCRIPTION OF THE DRAWINGS

FIG. 2A is a plan view of an insulating substrate of which one main surface is formed with signal lines according to a first embodiment of the present invention, and shows examples of signal lines having different widths;

FIG. 3 is an enlarged view of region III shown in FIG. 2C;

FIG. 4 is a graph showing a relationship between the remaining ratio of the ground layer and the transmission speed ratio of a signal;

FIG. 5 is a table showing a relationship between each mesh design and the transmission speed ratio of a signal and a relationship between each mesh design and the circuit width in the first embodiment of the present invention;

FIG. 7C is a plan view of the insulating substrate shown in FIG. 7A viewed from the side of the one main surface provided with the signal lines, but with the ground layer on the other main surface being transparently viewed;

FIG. 8 is an enlarged view of region VIII shown in FIG. 7C;

FIG. 9 is a table showing a relationship between each mesh design and the transmission speed ratio of a signal and a relationship between each mesh design and the circuit width in the second embodiment of the present invention;

FIG. 12 is an enlarged view of region XII shown in FIG. 11A;

FIG. 14 is a table showing an example of each mesh design in the third embodiment of the present invention.

DESCRIPTION OF THE PREFERRED EMBODIMENTS

First Embodiment

A first embodiment of the present invention will hereinafter be described with reference to the drawings. In the present embodiment, examples will be described in which a printed wiring board 1 according to the present invention may be applied to transmission lines that connect between circuits in a device, between a circuit and a device, or between devices. The printed wiring board 1 according to the present invention is suitable for transmission of high speed signals and performs differential signaling based on various standards, such as LVDS, MIPI, HDMI (registered trademark) and USB. The printed wiring board according to the present embodiment is provided with differential signal lines, which comprise at least one pair of signal lines and transmit signals in accordance with various standards to execute differential signaling. The form of the differential signal lines is not particularly limited, and a known form at the time of filing of the present application may be used to perform differential signaling.

Figure 1A:
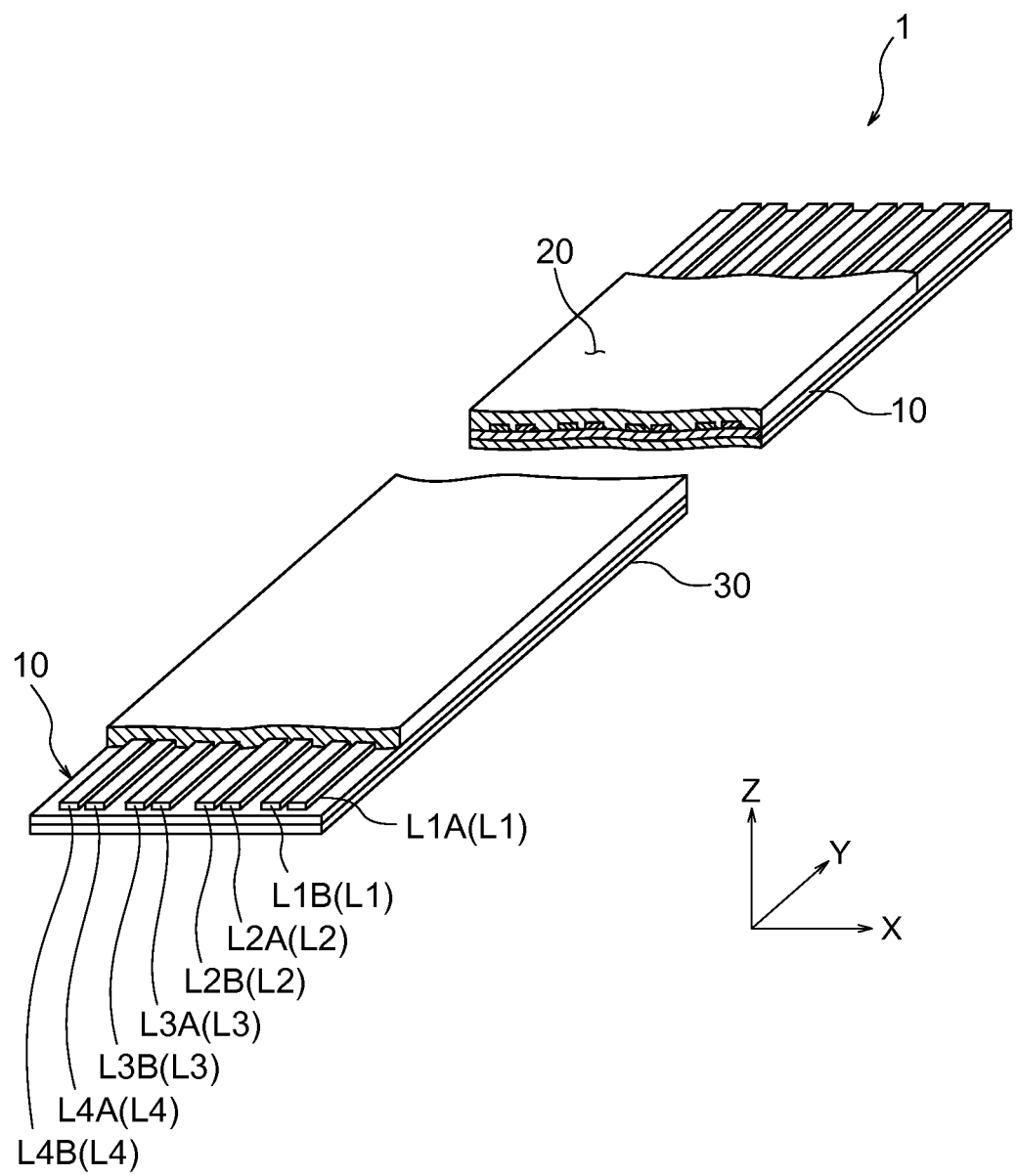
FIG. 1A is a perspective view viewed from the upper surface side when a part of a protective layer is removed from a printed wiring board according to an embodiment of the present invention.
Figure 1B:
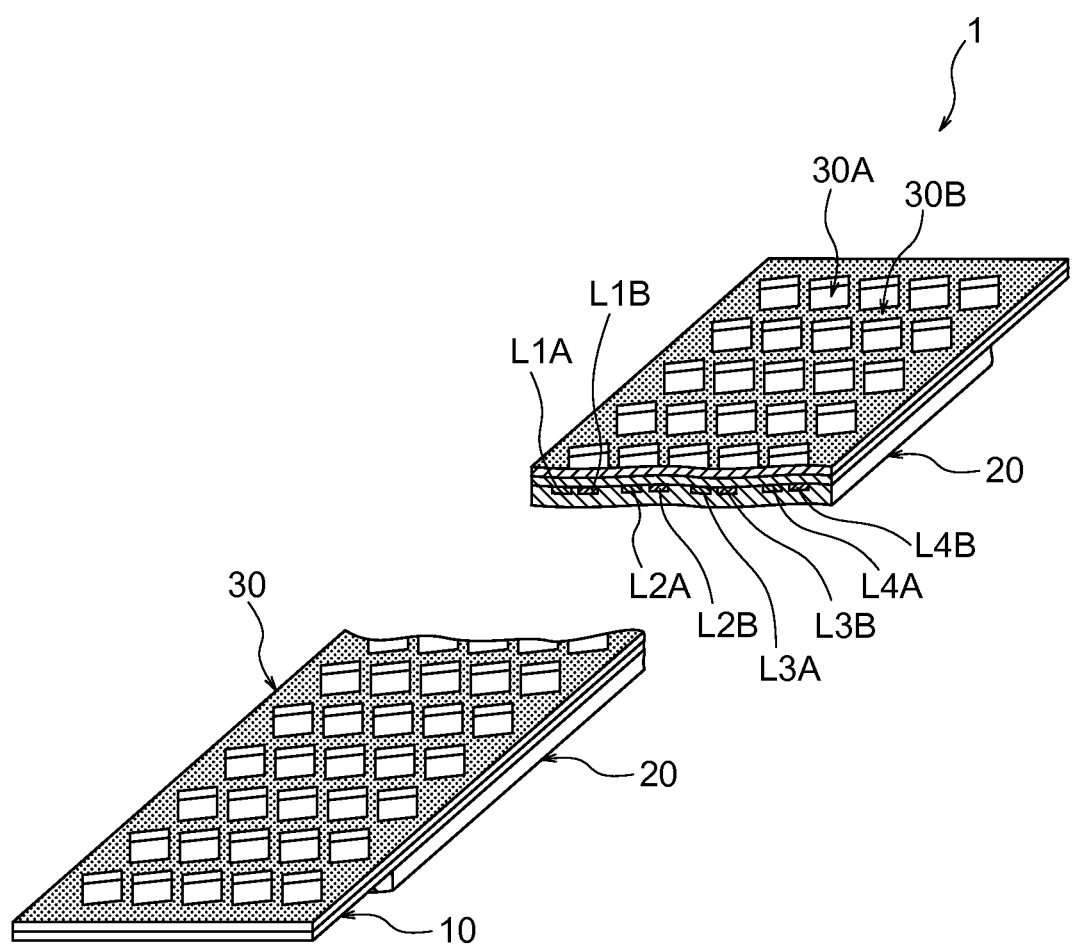
FIG. 1B is a perspective view, viewed from the lower surface side, of the printed wiring board according to an embodiment of the present invention.

FIG. 1A is a perspective view, viewed from one main surface side, of a state in which a part of a protective layer 20 is removed from the printed wiring board 1 according to the embodiment, while FIG. 1B is a perspective view, viewed from the other main surface side, of the printed wiring board 1 shown in FIG. 1A.

As shown in FIG. 1A, differential signal lines L1 to L4 are provided on a main surface (surface at the positive side of the Z-axis in the figure) of an insulating substrate 10 to extend along the Y-axis in the figure. Each pair of the differential signal lines L1 to L4 according to the present embodiment comprises paired signal lines and transmits differential signals. In the present embodiment, one of the paired signal lines that constitute each pair of the differential signal lines L1 to L4 is referred to as a first signal line, while the other is referred to as a second signal line.

Each pair of the differential signal lines L1 to L4 according to the present embodiment comprises paired signal lines, i.e., paired first and second signal lines. Specifically, the differential signal lines L1 have paired first and second signal lines L1A and L1B. Similarly, the differential signal lines L2 have paired first and second lines L2A and L2B. Differential signal lines L3 and L4 are also configured in a similar manner. In the differential signal lines, the second signal line is provided side by side with the first signal line so as to keep a certain distance therebetween.

Although not shown in the figure, the differential signal lines L1 to L4 according to the present embodiment each include a curved portion at which the extending direction varies, and the signal line present outside at the curve is defined as the first signal line, while the signal line present inside at the curve is defined as the second signal line. For example, when a degree of curving of each signal line that constitutes the differential signal lines can be expressed as a curvature, the signal line present at the side of the center of curvature is the second signal line, while the signal line present at a relatively separate outside position from the center of curvature is the first signal line. In the present embodiment, the curved portion refers to a portion at which the extending direction of the signal line varies, and the angle formed by the curved portion is not limited. The curved portion may be constituted of a curved segment or may also be constituted of straight segments connected at a vertex or at vertices.

In the present description, hereinafter, the differential signal lines L1 to L4 and other differential signal lines including the first signal lines and the second signal lines may also be referred to as "differential signal lines L100" in a collective term. The first signal line or lines that constitute the differential signal lines L100 may also be referred to as "first signal line(s) L110" in a collective term, and the second signal line or lines that constitute the differential signal lines with the differential signal lines L110 may also be referred to as "second signal line(s) L120" in a collective term.

As shown in FIG. 1A, the printed wiring board 1 according to the present embodiment comprises: a plurality of differential signal lines L1 to L4 formed at the side of one main surface of an insulating substrate 10; a protective layer 20 that covers the differential signal lines L1 to L4; and a ground layer 30 formed at the side of the other main surface of the insulating substrate 10. The printed wiring board 1 according to the present embodiment has a so-called microstrip line structure. The insulating substrate is interposed between the ground layer 30 and the differential signal lines L1 to L4.

The structure of the printed wiring board 1 according to the present embodiment is not limited to that shown in FIG. 1A. The printed wiring board 1 according to the present embodiment may also be configured as a so-called strip line structure that comprises: differential signal lines L1 to L4 formed at the side of one main surface of an insulating substrate 10; a protective layer (insulating layer) 20 that covers the differential signal lines L1 to L4; a ground layer (not shown) provided at the side of opened main surface of the protective layer (insulating layer) 20; and a ground layer 30 formed at the side of the other main surface of the insulating substrate 10. The differential signal lines L1 to L4 may also be configured to be interposed between upper and lower ground layers (not shown) formed via insulating substrates.

The printed wiring board 1 according to the present embodiment may also be configured as a so-called coplanar line structure that comprises: differential signal lines L1 to L4 formed at the side of one main surface of an insulating substrate 10; ground lines (not shown) that are formed at the side of the one main surface of the insulating substrate 10 and provided side by side with the differential signal lines L1 to L4; a protective layer (insulating layer) 20 that covers the differential signal lines L1 to L4 and the ground lines. The differential signal lines L1 to L4 and the ground lines are formed on the same main surface of the insulating substrate 10, and the protective layer 20 (insulating substrate) is interposed therebetween.

As shown in FIG. 1B, the ground layer 30 is formed at the lower surface side of the insulating substrate 10 according to the present embodiment. The ground layer 30 according to the present embodiment has a mesh structure in which a plurality of partial regions 30A are discretely removed so that the remaining region 30B constitutes the mesh structure. FIG. 1B exemplifies an example in which the mesh structure is constituted as an inclined grid pattern, but the pattern (design) of the mesh structure is not particularly limited. The mesh structure may also be a longitudinal or lateral grid pattern from which rectangular partial regions 30A are removed, a honeycomb pattern from which hexagonal partial regions 30A are removed, or a dot pattern from which circular partial regions 30A are removed.

A method of manufacturing the printed wiring board 1 according to the present embodiment will be described briefly. A double-sided conductor-clad laminate L is first prepared. This double-sided conductor-clad laminate L is a sheet-like member in which foil of metal such as copper is attached to each of both main surfaces of an insulating substrate 10 such as a polyimide (PI) substrate via an adhesive layer. Examples of material to be used for the insulating substrate 10 include polyethylene terephthalate (PET), polyethylene naphthalate (PEN), polyester (PE), and liquid crystal polymer (LCP). The metal foil formed on the other main surface at the opposite side to the one main surface of the printed wiring board 1 functions as the ground layer 30. The ground layer 30 comprises a desired mesh structure formed via an etching step. The remaining ratio of the ground layer 30 is controlled to a desired value. Signal lines L100 (and ground lines if necessary) are formed on the one main surface of the printed wiring board 1 by removing predetermined regions using an ordinary photolithography method. Thereafter, the signal lines L100 (and ground lines) are laminated with a sheet-like protective layer 20 that covers the signal lines L100 (and ground lines), and the printed wiring board 1 according to the present embodiment is obtained through heat treatment.

The first embodiment will be described with reference to FIG. 2A to FIG. 2C for an example in which the mesh structure is an inclined grid pattern.

Figure 2B:
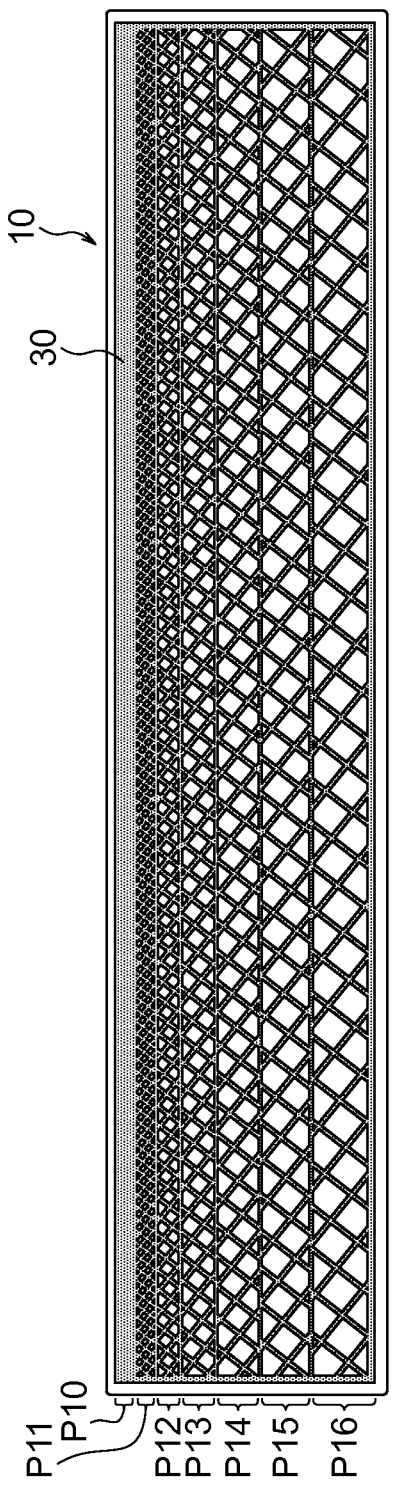
FIG. 2B is a plan view showing the lower surface side of the insulating substrate shown in FIG. 2A, and shows an example of a ground layer in which the remaining ratio and the region width vary.

FIG. 2A is a plan view, viewed from the side of one main surface, of an insulating substrate 10 formed with model signal lines L10 to L16 that are set up as models of signal lines in the first embodiment. As shown in FIG. 2A, the circuit width of each of the model signal lines L10 to L16 can have a different value. FIG. 2B is a plan view, viewed from the side of the other main surface, of the insulating substrate 10 formed with a ground layer 30 of an inclined grid pattern. FIG. 2C is a plan view of the insulating substrate 10 viewed from the side of the one main surface like in FIG. 2A, but with the ground layer 30 on the other main surface being transparently viewed. FIG. 2C represents the positional relationship between the model signal lines L10 to L16 and the ground layer 30. As shown in the figure, the model signal lines L10 to L16 are associated with regions P10 to P16 having respective predetermined widths determined based on the model signal lines L10 to L16.

As will be described later in detail, the remaining ratio of the ground layer 30 can be varied for a region (region D as will be described later) that corresponds to each of the regions P10 to P16 having respective predetermined widths based on the model signal lines L10 to L16. The region for which the remaining ratio is controlled is defined based on each position of the model signal lines L10 to L16. In the printed wiring board having the differential signal lines L100 according to the present embodiment, that region may be defined based on respective positions of each first signal line L110 and each second signal line L120 which constitute the differential signal lines L100, or may be defined based on the position of either one of the first signal line L110 or the second signal line L120, or may be based on the center position between the first signal line L110 and the second signal line L120. The region D for which the remaining ratio is controlled is defined based on the position of a curved portion of each of the differential signal lines L100. Although not particularly limited, it is preferred in the present embodiment that the region for which the remaining ratio is controlled is a region that includes a curved portion. In particular, it is preferred that the region for which the remaining ratio is controlled is a region from one end to the other end of a curved portion within which the signal line is not straight (the curvature is not zero). In this case, control of the remaining ratio is not performed for the ground layer 30 within a region that corresponds to a straight portion of each of the signal lines L100.

Figure 2C:
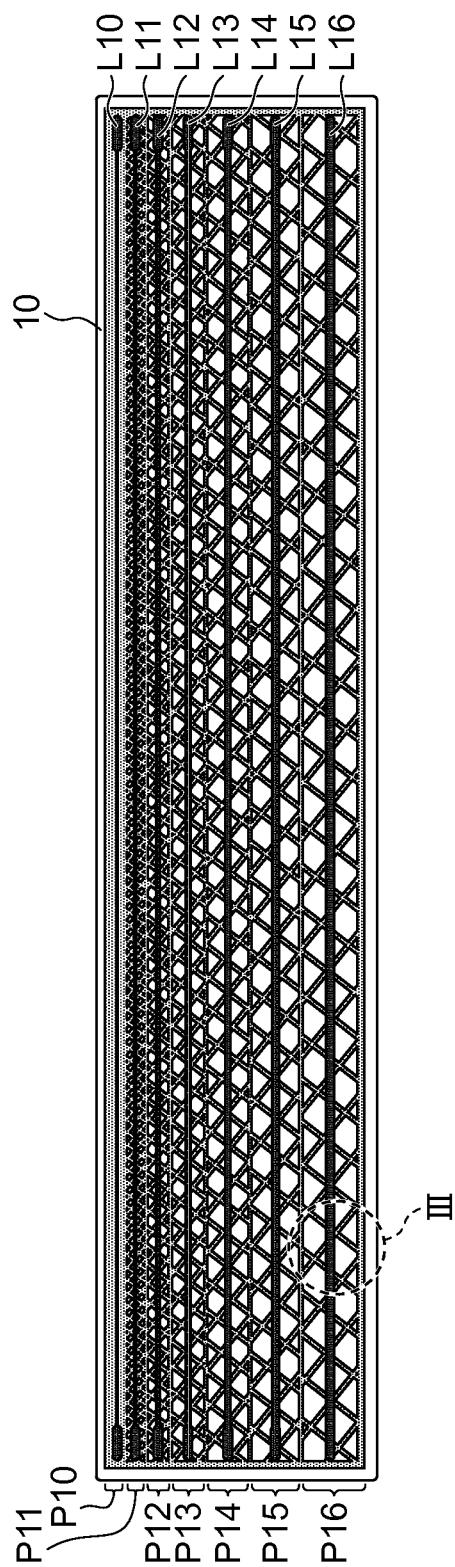
FIG. 2C is a plan view of the insulating substrate shown in FIG. 2A viewed from the side of the one main surface provided with the signal lines, but with the ground layer on the other main surface being transparently viewed.

FIG. 3 is an enlarged view of region III shown in FIG. 2C. The ground layer 30 shown in FIG. 3 has a mesh structure of an inclined grid pattern in which a plurality of partial regions 30A are discretely removed so that the remaining region 30B constitutes the mesh structure. Dashed line Q shown in FIG. 3 represents a reference position based on the position of the model signal line L16. In the present embodiment, a first region D1 is defined based on the position of the model signal line L16. For example, as shown in the figure, the first region D1 is defined based on the position Q which corresponds to the model signal line L16. The first region D1 for the ground layer 30 is defined by first predetermined widths W1R and W1L based on the position Q which corresponds to the model signal line L16. In the present embodiment, each position of the previously-described regions P10 to P16 is in common with the position of the first region D1 for the ground layer 30. The remaining ratio of the ground layer 30 corresponding to the first region D1 is controlled.

Descriptions regarding the model signal lines L10 to L16, in particular regarding the model signal line L16, can be applied to the first signal lines L110 and the second signal lines L120 which constitute the differential signal lines L100 according to the present embodiment. The first region D1 may be defined across both of right side and left side of each first signal line L110 (position Q), or may otherwise be defined at either side. The first predetermined width W1R at the right side of the first signal line L110 may have a different value from that of the first predetermined width W1L at the left side of the first signal line L110. When the distance between the first signal line L110 and the counterpart second signal line L120 is small, one of the right side and the left side of the first signal line L110 is provided with a narrow region while the other is provided with a wide region. Setting method for the first region D1 has been described herein, but the same method can be applied to set a second region D2.

According to the present embodiment, the ground layer 30 is formed such that the remaining ratio of a first ground layer 30 corresponding to the first region D1 is lower than the remaining ratio of a second ground layer 30 corresponding to the second region D2. The first region D1 is defined based on the position of each first signal line L110 and has the first predetermined widths W1R and W1L. The second region D2 is defined based on the position of each second signal line L120 and has the second predetermined widths W2R and W2L. The remaining ratio of the ground layer 30 can be controlled by a removal amount (removal ratio) of a conductor, such as copper, which functions as ground.

Descriptions will then be directed to a method of calculating the remaining ratio of the ground layer 30 according to the present embodiment. In the present embodiment, the remaining ratio of the first ground layer 30 having a mesh structure is defined by the width of a remaining region and the width of removed partial regions. According to the present embodiment, the ground layer 30 has a mesh structure thereby to allow the remaining ratio to be arbitrarily controlled using a method of removing the ground layer 30, such as etching. In particular, when the mesh structure of the ground layer 30 is configured with a regular graphical pattern, prediction of the remaining ratio can be readily performed, so that the ground layer 30 having a desired remaining ratio can be obtained through etching treatment. This allows the ground layer 30 to have any remaining ratio for each signal line.

With reference to FIG. 3, a method of calculating the remaining ratio of the ground layer 30 when the ground layer 30 has a mesh structure of an inclined grid pattern will be described. In the present embodiment, the remaining ratio of the ground layer 30 is defined as a ratio of a surface area occupied by the region 30B (light gray part in the figure) in which the conductor exists to the total surface area of a predetermined region of the insulating substrate 10 formed with the ground layer 30, i.e., the total of the region 30B in which the conductor exists and the regions 30A from which the conductor has been removed. The predetermined region D of the insulating substrate 10 formed with the ground layer 30 is defined by a length LG along the extending direction of the signal lines L100 and the predetermined widths W1L and W1R along the width direction of the signal lines. The length LG along the extending direction of the signal lines L100 is defined in accordance with a length of a curved portion, which is not shown in the present example. The predetermined widths W1L and W1R are defined based on the position Q at which each of the signal lines L100 is provided.

In the present embodiment, the remaining ratio of the ground layer 30 is calculated based on a circuit width ML to form the grid pattern shown in FIG. 3 and a width MS of the partial regions from which the conductor has been removed. That is, the remaining amount of the ground layer 30 is calculated from the circuit width ML to form the grid pattern, and the removal amount of the ground layer 30 is calculated from the width MS of the partial regions.

When the ground layer 30 has a mesh structure other than the inclined grid pattern, the surface area of the region in which the ground layer 30 remains and the surface area of the partial regions from which the ground layer 30 has been removed can be appropriately calculated using a geometric method. However, the method of calculating the remaining ratio of the ground layer 30 is not limited to such a geometric calculation method. The surface area of the region in which the ground layer 30 remains and the surface area of the partial regions from which the ground layer 30 has been removed may also be calculated based on features, such as color, on image data obtained by image analysis of an captured image via a camera.

Specifically, in the present embodiment, the remaining ratio of the ground layer 30 may be obtained using Equation 1 below, for example. The remaining ratio of the ground layer 30 corresponding to the first region based on each first signal line L110 that constitutes the differential signal lines, and the remaining ratio of the ground layer 30 corresponding to the second region based on each second signal line L120 that constitutes the differential signal lines, can be calculated by the same method.

$$\text{Remaining ratio } [\%] = [1 - \{MS^2/(ML+MS)^2\}] \times 100 \quad (1)$$

In the present embodiment, the width of the first region D1 based on the first signal line L110 is larger than the width of the second region D2 based on the second signal line L120. As shown in FIG. 3, the remaining ratio is controlled in the ground layer 30 corresponding to the first region D1 which has a width defined by the predetermined widths W1R and W1L based on the position Q of the first signal line L110. Similarly, the remaining ratio is controlled in the ground layer 30 corresponding to the second region D2 which has a width defined by the predetermined widths W2R and W2L based on the position Q of the second signal line L120.

FIG. 4 shows a relationship between the remaining ratio of the ground layer 30 and a transmission speed ratio of a signal. The transmission speed ratio is a ratio of a transmission speed to the transmission speed when the remaining ratio of the ground layer 30 is 100%, i.e., when no removed portions exist. As shown in FIG. 4, as the remaining ratio of the ground layer 30 decreases, the transmission speed ratio becomes high. In other words, there is a tendency that, as the remaining ratio of the ground layer 30 decreases, the transmission speed becomes high.

Impedance Z is given by $Z=\sqrt{(L/C)}$ using an inductance L and a capacitance C of a unit length of a signal line that constitutes the differential signal lines L100. Transmission speed V of a signal can be represented by $V=1/\sqrt{(LC)}$. If the remaining ratio of a conductor of the ground layer 30 that exists in a position opposing the differential signal lines L100 is reduced, the capacitance C of a unit length of the differential signal lines L100 can be reduced, so that the transmission speed increases. Increasing the transmission speed V in such a manner can eliminate a delay in transmission time which is generated between signal lines having different physical lengths. As will be understood, it is preferred that the impedance Z is maintained at a fixed value.

According to the present embodiment, the remaining ratio of the ground layer 30 corresponding to the first signal line L110 provided outside at the curved portions of the differential signal lines is set lower than the remaining ratio of the ground layer 30 corresponding to the second signal line L120 provided inside at the curved portions of the differential signal lines. In this manner, the transmission speed of a signal propagating in the first signal line L110 provided outside at the curved portion can be faster than the transmission speed of a signal propagating in the second signal line L120 provided inside at the curved portion. Since the first signal line L110 provided outside at the curved portion has a longer physical length than that of the second signal line L120, if the transmission speed of signals is the same, a difference (delay) in transmission time is generated depending on the difference in length between the signal lines. According to the present embodiment, such a difference in transmission time generated due to the difference in length between the signal lines is adjusted (controlled) using the remaining ratio of the ground layer 30. This can suppress the occurrence of a difference in transmission time between differential signals at the curved portions of the paired signal lines which constitute differential signal lines and have different lengths. As a result, a printed wiring board having high transmission quality can be provided.

In the wiring board obtained using the disclosure of Patent Document 1 (Prior Art Document), portions at which a difference is generated between lengths of the wirings and portions at which the transmission speed is adjusted are different, so that a difference is partially generated between the transmission speeds in the pair of signal lines even though the delay state is finally solved. Misaligned signals will be propagated in common-mode to generate radiation noise. For the wiring board obtained using the disclosure of Patent Document 1, the radiation noise was measured using a near magnetic field probe and a spectrum analyzer when signals were input thereto using a pulse pattern generator. The maximum value of the magnetic field (radiation noise) from the printed wiring board 1 according to the present embodiment was smaller by about 10 dB than that from the wiring board obtained using the disclosure of Patent Document 1.

In particular, in differential signal lines, lengths of the differential signal lines may have to be the same because the signals should be synchronized at the receiving end. When the differential signal lines have curved portions each having a curvature, wiring on the substrate will be complicated because of the different lengths, which may be disadvantageous. According to the present embodiment, the remaining ratio of the ground layer 30 corresponding to the first region as defined in the above-described manner can be controlled thereby to allow the synchronization of signals at the receiving end.

It is preferred that the width of the ground layer 30 corresponding to the region D1 based on the first signal line L110 provided outside at the curved portion is set larger than the width of the ground layer 30 corresponding to the region D2 based on the second signal line L120 provided inside at the curved portion. In the present embodiment, the remaining ratio of the ground layer 30 corresponding to the first signal line L110 provided outside at the curved portion is relatively low. This region of the ground layer 30 having a low remaining ratio can be set relatively wide thereby to more reduce the existing ratio of the ground layer 30 corresponding to the first signal line L110 provided outside at the curved portion. This allows the transmission speed to be relatively fast in the first signal line L110 which is provided outside at the curved portion and has a long physical length, so that the transmission time of a signal can be controlled.

It is preferred that the width W1R+W1L of the first region D1 based on the first signal line L110 is a natural number multiple of the circuit width L (L1) of the first signal line L110. In particular, it is preferred that the width of the first region D1 is three times or more of the circuit width L1 of the first signal line L110. Similarly, it is preferred that the width W2R+W2L of the second region D2 based on the second signal line L120 is a natural number multiple of the circuit width L (L2) of the second signal line L120. In particular, it is preferred that the width of the second region D2 is three times or more of the circuit width L2 of the second signal line L120. According to the present embodiment, the region from which parts of the ground layer 30 are extracted (removed) to configure a mesh structure having a predetermined remaining ratio has a width of three times or more of the circuit width L of the signal line. This allows the transmission speed ratio to be kept at a fixed value thereby to improve the transmission characteristics.

As described above, when the remaining ratio of the ground layer 30 is varied to adjust the transmission speed in the signal lines L100, the characteristic impedance of each of the signal lines L100 also varies. According to the present embodiment, therefore, the circuit widths L1 and L2 of the signal lines L100 are made large. According to the present embodiment, the circuit width L1 of the first signal line L110 is made larger than the circuit width (line width) L2 of the second signal line L120 because of adjusting the remaining ratio of the ground layer 30 corresponding to the first signal line L110 provided outside at the curved portion. This can suppress the variation in the impedance of the first signal line L110 caused due to the variation in the remaining ratio of the ground layer 30.

Working Example 1

A working example of a wiring board according to the present embodiment will hereinafter be described.

A copper-clad laminate was prepared such that each main surface of a polyimide substrate of a thickness of 25 mm was laminated with copper foil of a thickness of 18 µm via an adhesive of a thickness of 10 µm. Holes for through-holes were opened in the copper-clad laminate using a drill of 0.15 mm. The through-holes were formed to connect ground pads GPs (see FIG. 11A) with a lower surface ground layer (see FIG. 11A, for example). Copper plating of 15 µm was formed on the copper foil surfaces and in the through-holes. Subsequently, etching was performed using photolithography method to form signal lines L100 at the side of one main surface of the copper-clad laminate and a ground layer 30 of a mesh structure on the other main surface. Furthermore, the copper foil-exposed part was attached, in an opened state, to a cover film comprising a polyimide substrate of a thickness of 12.5 µm and an adhesive of a thickness of 40 µm, and a flexible printed wiring board (FPC) was thus manufactured.

The width of the signal lines L100 was 100 µm, and the length was 100 mm. Wiring boards were obtained in which the remaining ratio of the ground layer 30 was changed among 100% (no removed portions), 75%, 55.6%, 43.8%, 36%, 30.6%, and 26.5%. In addition, wiring boards were obtained in which the ratio between each of the width of the first region corresponding to the first signal line L110 and the width of the second region corresponding to the second signal line L120 and each width of the signal lines L110 and L120 was changed among 1, 2, 3, 5, 7, and 9. Furthermore, wiring boards were manufactured by way of trial with the circuit width changed at 10 µm intervals between 80 to 400 µm, among which a wiring board having a characteristic impedance of $Z_0=50\Omega$ was selected and the transmission speed ratio $v/v_0$ was calculated.

In the present working example, the transmission speed in the signal lines L100 was measured using TDR (Sampling Oscilloscope TDS8200 and TDR Module 80E40 both available from Tektronix, Inc). Time for a TDR waveform is supposed to be 2t from the interface between the probe and the FPC to an open end. Time required for a signal to pass through a sample is t because a reflected voltage waveform is measured in TDR. When the measured time for 100% of the remaining ratio of the ground layer 30 (no removed portions) is $t_0$, the transmission speed $V_0$ of the signal is represented by $V_0=L/t_0$. Here, L is the length of the sample. Similarly, the transmission speed V of a signal for each remaining ratio of the ground layer 30 is represented by V=L/t. The transmission speed ratio is defined as $V/V_0$.

The relationship between design indices for the mesh structure and the transmission speed ratio is shown in FIG. 5. The design indices for the mesh structure include the remaining ratio of the ground layer 30, the circuit width ML to form the grid pattern, and the width MS of the partial regions from which the conductor has been removed. Here, the transmission speed ratio $V/V_0$ refers to a ratio of the transmission speed V in each wiring board to the transmission speed $V_0$ in the wiring board having no removed portions of the ground layer 30. The transmission speed ratio $V/V_0$ was measured for each of grand extraction widths P10 to P16, or each D. The grand extraction width refers to a region corresponding to the region D (D1, D2) from which portions of the ground layer 30 are extracted (removed) to configure the mesh structure having a predetermined remaining ratio. In the present embodiment, the region corresponding to the region D (D1, D2) to be formed with the mesh structure having a predetermined remaining ratio was defined by a natural number multiple of the circuit width L (L1, L2) of the signal line.

As shown in FIG. 5, as the remaining ratio of the ground layer 30 decreases, the transmission speed ratio increases. That is, the transmission speed increases. Note that FIG. 5 shows examples of a combination of the circuit width ML to achieve the mesh structure (inclined grid pattern) of each remaining ratio and the width MS of partial regions from which the conductor has been removed, but the present invention is not limited thereto.

According to the present embodiment, as shown in FIG. 5, the circuit width of the signal lines L100 can be widened (increased) thereby to increase the transmission speed ratio in a state in which the impedance $Z_0$ is kept at $Z_0=50\Omega$. That is, the transmission speed can be increased with a fixed impedance.

Figure 6:
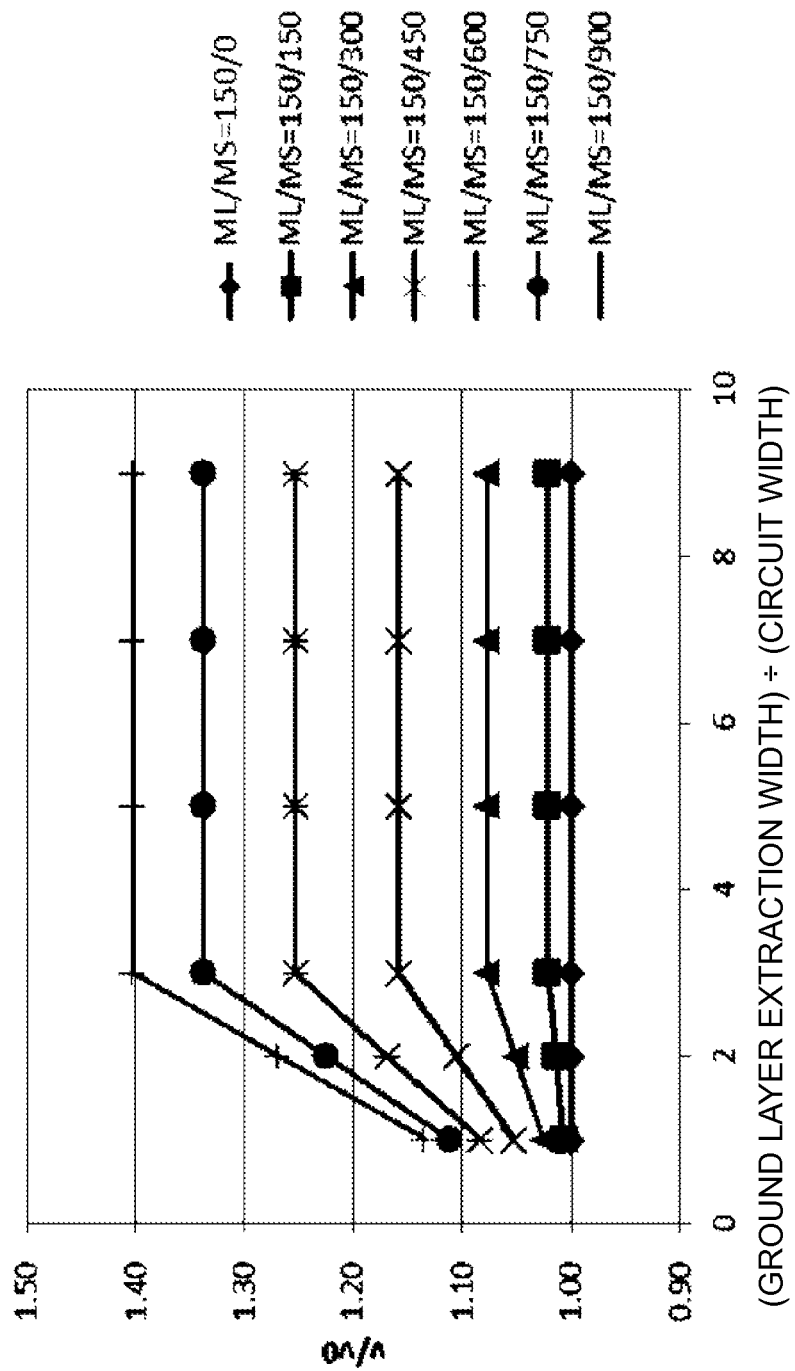
FIG. 6 is a graph showing a relationship between the width of the ground layer and the transmission speed ratio of a signal in the first embodiment of the present invention.

Moreover, as shown in the figure, as the extraction width of the ground layer 30 (width of the region D) increases, the amount of variation in the transmission speed ratio decreases. FIG. 6 shows a relationship between the ratio of the extraction width of the ground layer 30 (width of the region D) to the circuit width of the signal line and the transmission speed ratio. In order to keep constant the transmission speed ratio, it is preferred that the extraction width of the ground layer 30, i.e., the width of the region D defined based on the signal lines L100, is three times or more of the circuit width L of the signal lines L100. This can provide a wiring board having stable transmission characteristics.

As shown in FIGS. 5 and 6, the remaining ratio of the ground layer 30 can be reduced thereby to increase the transmission speed. According to the present embodiment, the remaining ratio of the ground layer 30 corresponding to the first signal line L110 provided outside at the curved portion can be relatively reduced to adjust the transmission speed, thereby eliminating the delay in transmission time due to the physical length of the signal line being long.

As shown in FIGS. 5 and 6, the circuit width L of the signal line can be increased thereby to increase the transmission speed while keeping constant the impedance. According to the present embodiment, the circuit width of the first signal line L110 provided outside at the curved portion can be relatively increased thereby to eliminate the delay in transmission time due to the physical length of the first signal line L110 being long, while keeping the impedance at a predetermined value.

As shown in FIGS. 5 and 6, the extraction width of the ground layer 30 (first region, second region) can be set three times or more of the circuit width L of the signal lines L100 thereby to keep constant the transmission speed ratio.

In the first embodiment, the remaining ratio of the ground layer 30 has been described using the signal lines L100 in a straight form for illustrative purposes. It is preferred that the circuit width L of the signal lines L100 and the remaining ratio of the ground layer 30 as described in the first embodiment are controlled at curved portions at which the extending direction of the signal lines L100 varies.

Second Embodiment

With reference to FIG. 7A to FIG. 10, the second embodiment will hereinafter be described. The second embodiment has a different feature that the mesh structure of the ground layer 30 is configured of a longitudinal grid pattern. Basic features and actions of the second embodiment are common with those of the first embodiment. Here, to avoid repetition in descriptions, descriptions for the common features are borrowed from those for the first embodiment.

Figure 7A:
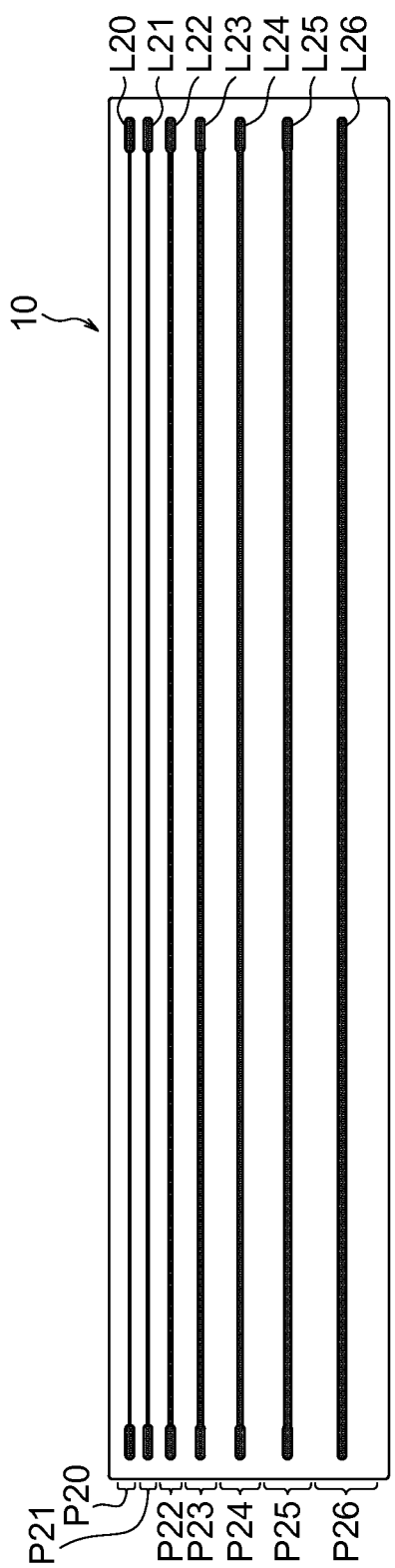
FIG. 7A is a plan view of an insulating substrate of which one main surface is formed with signal lines according to a second embodiment of the present invention, and shows examples of signal lines having different widths.
Figure 7B:
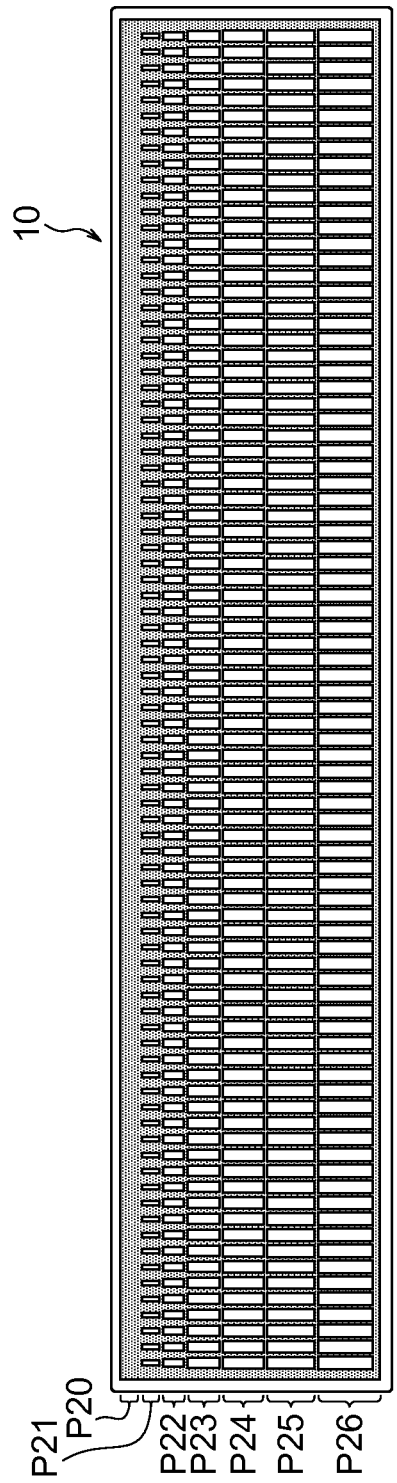
FIG. 7B is a plan view of the lower surface side of the insulating substrate shown in FIG. 7A, and shows an example of a ground layer in which the remaining ratio and the region width vary.

FIG. 7A is a plan view, viewed from the side of one main surface, of an insulating substrate 10 formed with model signal lines L20 to L26 in the second embodiment. FIG. 7B is a plan view, viewed from the side of the other main surface, of the insulating substrate 10 formed with a ground layer 30 of a longitudinal grid pattern. FIG. 7C is a plan view of the insulating substrate 10 viewed from the side of the one main surface like in FIG. 7A, but with the ground layer 30 on the other main surface being transparently viewed. As shown in FIG. 7C, the model signal lines L20 to L26 are associated with regions P20 to P26 having respective predetermined widths based on the model signal lines L20 to L26. The remaining ratio of the ground layer 30 is varied for each region D corresponding to each of the regions P20 to P26.

FIG. 8 is an enlarged view of region VIII shown in FIG. 7C. The ground layer 30 shown in FIG. 8 has a mesh structure of a longitudinal grid pattern in which a plurality of partial regions 30A are discretely removed so that the remaining region 30B constitutes the mesh structure.

Descriptions regarding the model signal lines L20 to L26 can be applied to the first signal lines L110 and the second signal lines L120 which constitute the differential signal lines L100 according to the present embodiment.

Also in the ground layer 30 having a mesh structure of a longitudinal grid pattern according to the present embodiment, the ground layer 30 is formed such that the remaining ratio of a first ground layer 30 corresponding to a first region D1 is lower than the remaining ratio of a second ground layer 30 corresponding to a second region D2. The first region D1 is defined based on the position of each first signal line L110 and has first predetermined widths W1R and W1L.

The second region D2 is defined based on the position of each second signal line L120 and has second predetermined widths W2R and W2L.

Referring to FIG. 8, the remaining ratio of the ground layer 30, the predetermined regions, and the method of calculating them when the ground layer 30 has a mesh structure of a longitudinal grid pattern are basically common with those in the method of calculation in the first embodiment. In the present embodiment, the remaining ratio of the ground layer 30 is calculated based on a circuit width LL to form the grid pattern shown in FIG. 8 and a width LS of partial regions from which the conductor has been removed. That is, the remaining amount of the ground layer 30 is calculated from the circuit width LL to form the grid pattern, and the removal amount of the ground layer 30 is calculated from the width LS of the partial regions.

Specifically, in the present embodiment, the remaining ratio of the ground layer 30 can be obtained using Equation 2 below.

$$\text{Remaining ratio [\%]} = \{LL/(LL+LS)\} \times 100 \quad (2)$$

As shown in FIG. 8, the ground layer 30 in which the remaining ratio is controlled is provided to correspond to the region D having a width that is defined by the predetermined widths W1R and W1L based on the position Q of each signal line L100.

Figure 10:
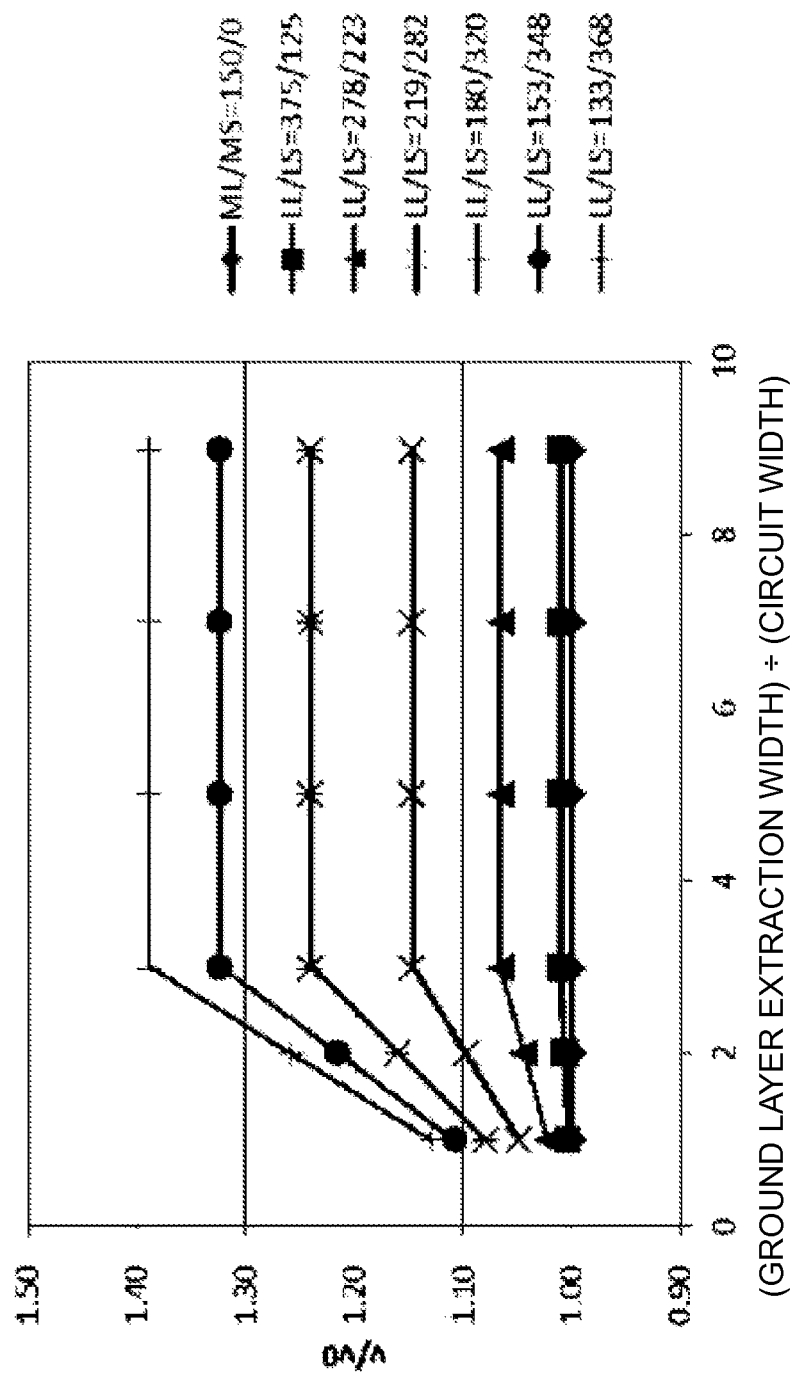
FIG. 10 is a graph showing a relationship between the width of the ground layer and the transmission speed ratio of a signal in the second embodiment of the present invention.

Each printed wiring board 1 according to a second working example of the second embodiment was manufactured under the same conditions as those in the first working example of the first embodiment. The second working example is different in that the mesh structure of the ground layer 30 is a longitudinal grid pattern, but other conditions are common with those in the first working example. FIG. 9 shows a relationship between the transmission speed ratio and the remaining ratio of the ground layer 30, and FIG. 10 shows a relationship between the ratio of the extraction width of the ground layer 30 to the circuit width of the signal line and the transmission speed ratio. The tendency in the relationship between design indices for the mesh structure and the transmission speed ratio as shown in FIG. 9 and FIG. 10 is common with the result of the first working example shown in FIG. 5. Thus, also in the case of the mesh structure of a longitudinal grid, similar actions and effects to those in the first working example can be achieved.

Third Embodiment

With reference to FIG. 11A to FIG. 14, the third embodiment according to the present invention will be described.

In the first and second embodiments, descriptions have been made for a method in which the remaining ratio of the ground layer 30 is controlled to adjust the transmission speeds in a pair of signal lines thereby to suppress the occurrence of a difference in transmission time in the signal lines. In the present embodiment, descriptions will be made for an example in which the above method of suppressing the occurrence of a difference in transmission time is applied to a printed wiring board comprising differential signal lines L100 provided with a curved area C. Basic parts in the third embodiment are common with those in the first and second embodiments. Here, to avoid repetition in descriptions, descriptions for the common matters are borrowed from those for the first and second embodiments.

Figure 11A:
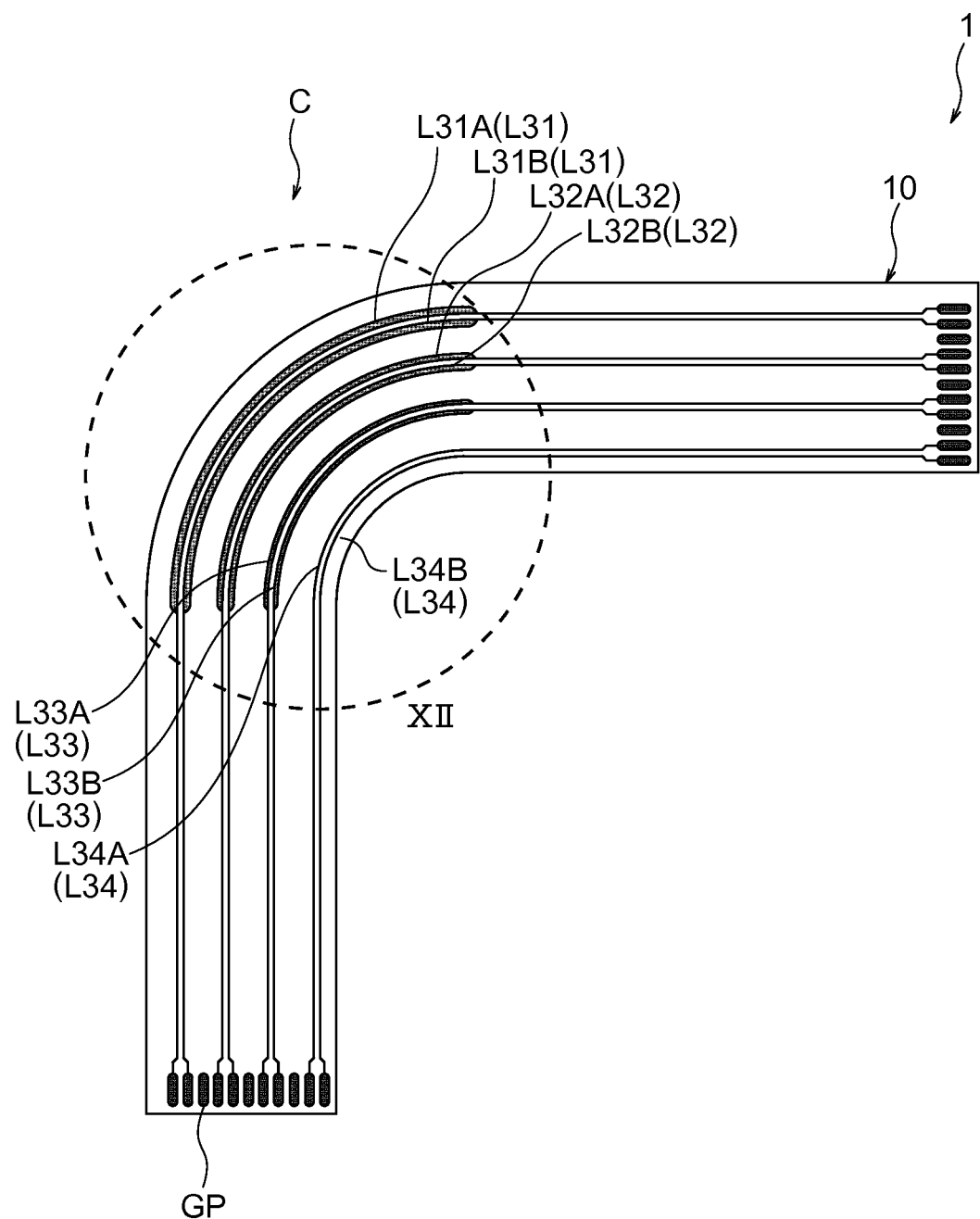
FIG. 11A is a plan view of an insulating substrate of which one main surface is formed with curved portions of signal lines according to a third embodiment of the present invention, and shows examples of signal lines having different widths.

FIG. 11A is a plan view, viewed from the side of one main surface, of an insulating substrate 10 formed with four pairs of differential signal lines L31 to L34. As shown in the figure, the differential signal lines L31 to L34 each have a curved portion within the curved area C at which the extending direction varies. The differential signal lines L31 have pared signal lines L31A and L31B. Similarly, the differential signal lines L32 to L34 have pared signal lines L32A and L32B, pared signal lines L33A and L33B, and pared signal lines L34A and L34B, respectively. Hereinafter, the signal lines in the third embodiment may also be referred to as "signal lines L100" in a collective term.

Figure 11B:
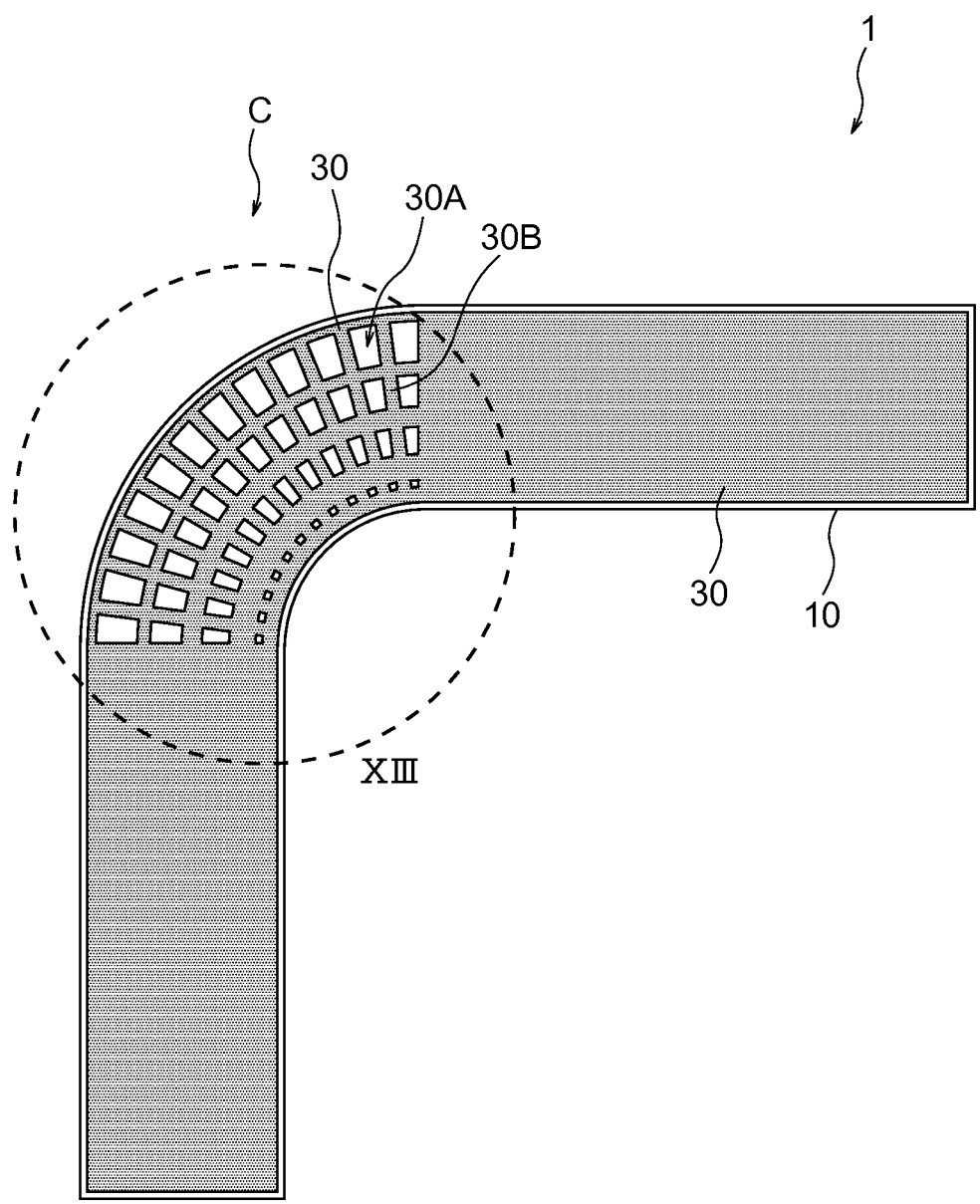
FIG. 11B is a view when the lower surface side of a ground layer is transparently viewed through the insulating substrate from which the signal lines shown in FIG. 11A are removed, and shows an example of the ground layer in which the remaining ratio and the region width vary.

FIG. 11B is a view when the lower surface side of the ground layer is transparently viewed through the insulating substrate from which the signal lines shown in FIG. 11A are removed, and shows an example of the ground layer in which the remaining ratio and the region width vary. In other words, FIG. 11B is a plan view when the lower surface side of the ground layer 30 of a grid pattern is transparently viewed from the side of the insulating substrate 10. As shown in FIG. 11B, the remaining ratio of the ground layer 30 and the width of a region in which the ground layer 30 with the controlled remaining ratio is formed can be varied.

Figure 11C:
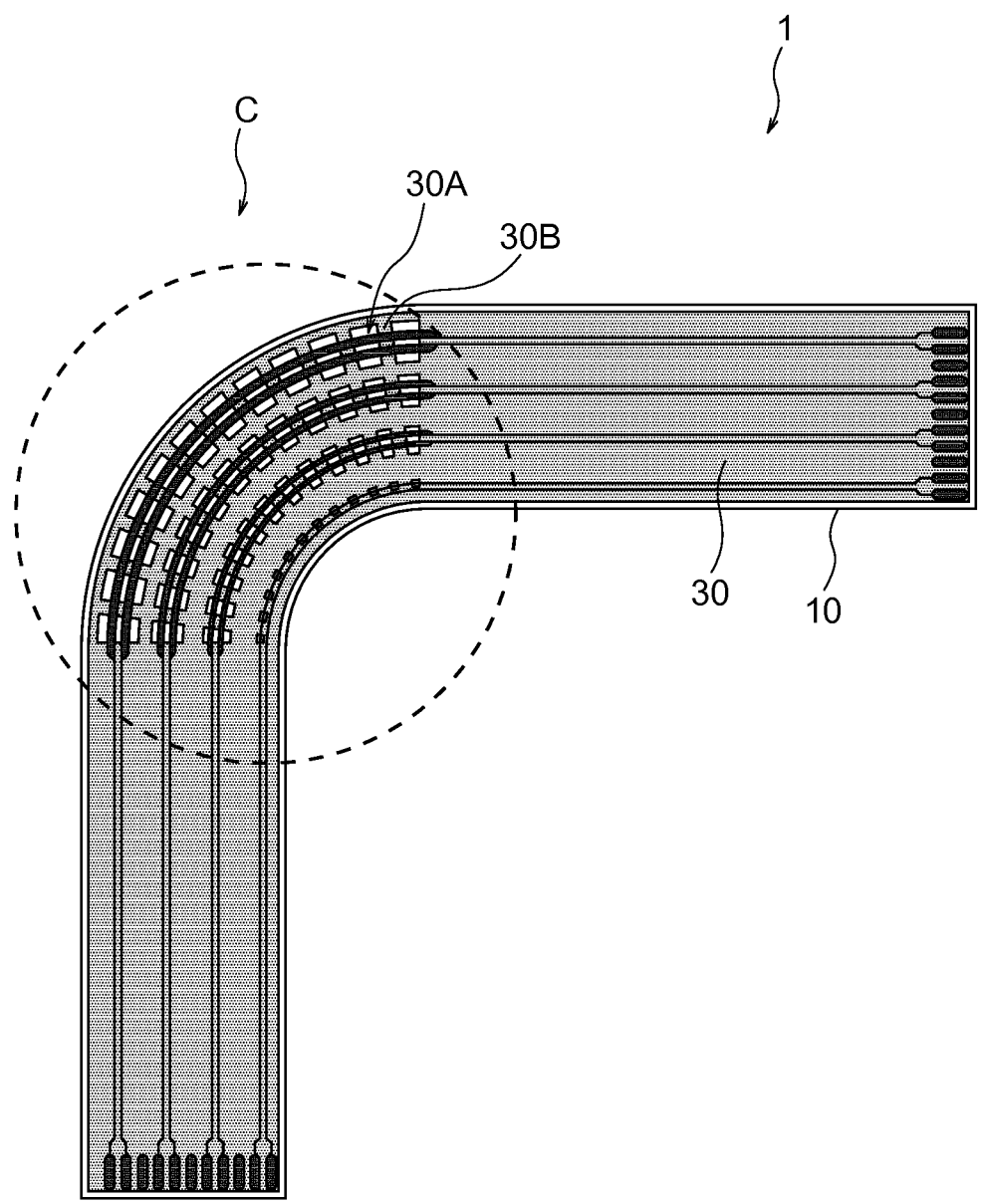
FIG. 11C is a plan view of the insulating substrate shown in FIG. 11A viewed from the side of the one main surface provided with the signal lines, but with the ground layer on the other main surface being transparently viewed.

FIG. 11C is a plan view of the insulating substrate 10 viewed from the side of the one main surface like in FIG. 11A, but with the ground layer 30 on the other main surface being transparently viewed. FIG. 11C represents the positional relationship between the differential signal lines L31 (L31A and L31B) to L34 (L34A and L34B) and the ground layer 30.

FIG. 12 is an enlarged view of region XII shown in FIG. 11A. As shown in FIG. 12, the differential signal lines L31 to L34 have paired signal lines L31A and L31B to L34A and L34B, respectively, and each of the differential signal lines L31 (L31A and L31B) to L34 (L34A and L34B) has a curvature determined based on the center X of curvature. According to the present embodiment, the first signal line L31A is configured to have a larger circuit width than that of the second signal line L31B in view of impedance matching in the differential signal lines L31. In addition, as shown in FIG. 12, in the signal lines L31A, L31B to L34A and L34B provided side by side with one another in the curved area C of the differential signal lines, the circuit width of the signal line L31A provided outside at the curved portion is set larger than the circuit width of the signal line L31B provided inside at the curved portion (provided at the side of the center X of curvature). Also in adjacent differential signal lines, it is preferred to adjust the circuit widths. As an example, the signal line L33B is configured to have a larger circuit width than an average of the circuit widths of the signal lines L34A and L34B. As another example, the signal line L33B is configured to have a larger circuit width than that of the signal line L34B or that of the signal line L34A. This allows the transmission speed to be controlled while ensuring impedance matching among the plurality of differential signal lines L31 to L34.

Figure 13:
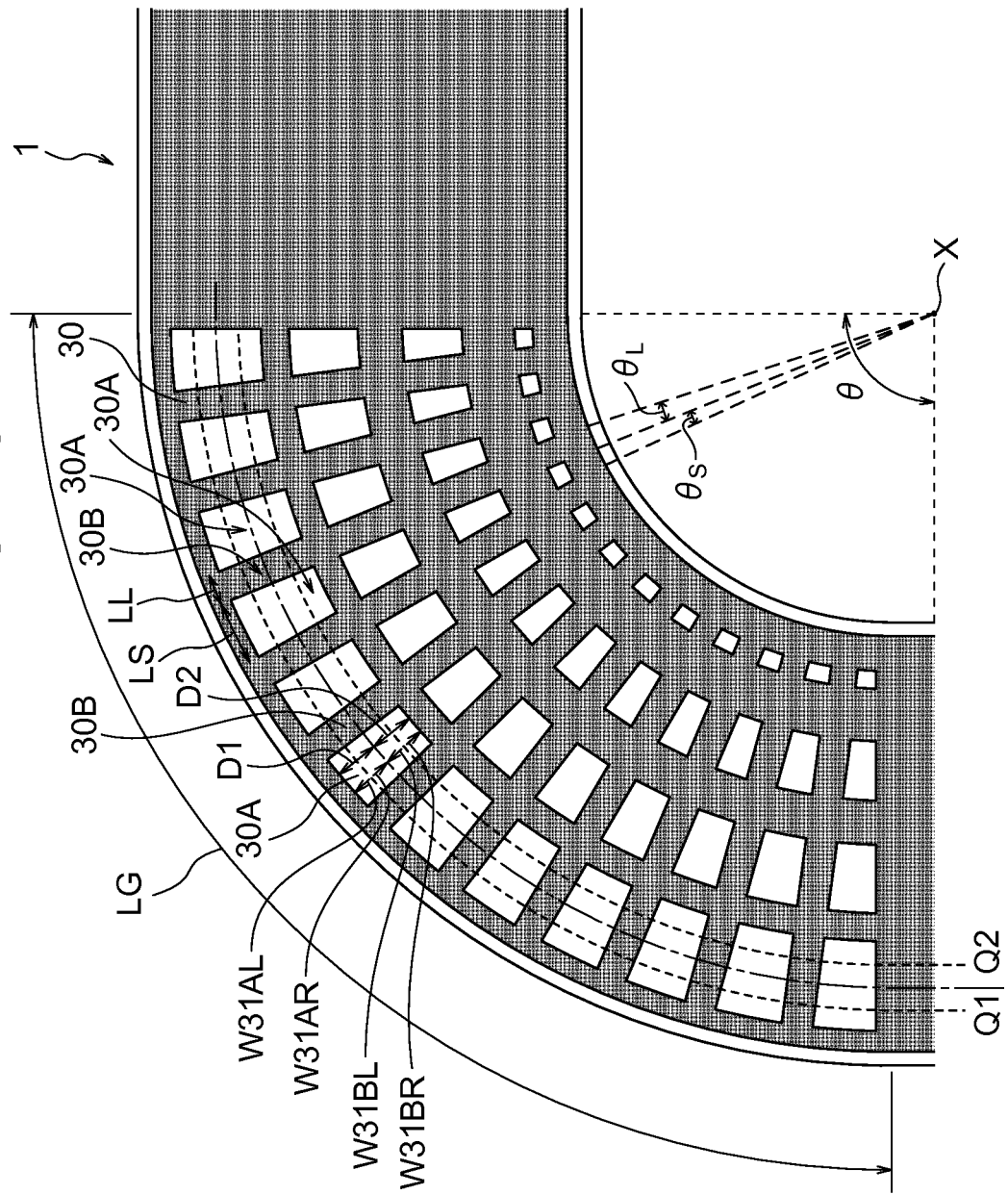
FIG. 13 is an enlarged view of region XIII shown in FIG. 11B.

FIG. 13 is an enlarged view of region XIII shown in FIG. 11B. The ground layer 30 shown in FIG. 13 has a mesh structure of a sector-shaped grid pattern in which a plurality of partial regions 30A are discretely removed so that the remaining region 30B constitutes the mesh structure. Dashed lines Q1 and Q2 represent reference positions based on the positions of the signal lines L31A and L31B that constitute the differential signal lines L31. As shown in the figure, a first region D1 is defined by first predetermined widths W31AR and W31AL on the basis of the position Q1 corresponding to the signal line L31A, while a second region D2 is defined by second predetermined widths W31BR and W31BL on the basis of the position Q2 corresponding to the signal line L31B. Boundary (shown by dashed line in the figure) between the first region D1 and the second region D2 is located at the middle (center) between the positions Q1 and Q2. A first ground layer 30 having a predetermined remaining ratio is formed to correspond to the first region D1 at the lower surface side of the insulating substrate 10. A second ground layer 30 having a predetermined remaining ratio is formed to correspond to the second region D2 at the lower surface side of the insulating substrate 10. Each of the first region D1 and the second region D2 may be defined across both of right side and left side of each of the first signal line L31A and the second signal line L31B, or may otherwise be defined at either of right side or left side of each of the first signal line L31A and the second signal line L31B. The first predetermined width W31AR at the right side of the first signal line L31A may have a different value from that of the first predetermined width W31AL at the left side of the first signal line L31A. When the distance between the first signal line L31A and the second signal line L31B is small, one of the right side and the left side is provided with a narrow region while the other is provided with a wide region.

According to the present embodiment, the ground layer 30 is formed such that the remaining ratio of the first ground layer 30 corresponding to the first region D1 is lower than the remaining ratio of the second ground layer 30 corresponding to the second region D2. Again, the first region D1 is defined based on the position of the first signal line L31A and has the first predetermined widths W31AR and W31AL, while the second region D2 is defined based on the position of the second signal line L31B and has the second predetermined widths W31BR and W31BL. The remaining ratio of the ground layer 30 can be controlled by a removal amount (removal ratio) of a conductor, such as copper, which functions as ground, like in the first and second embodiments.

With reference to FIG. 13, a method of calculating the remaining ratio of the ground layer 30 when the ground layer 30 has a mesh structure of a sector-shaped grid pattern will be described. In the present embodiment, the remaining ratio of the ground layer 30 is defined as a ratio of a surface area occupied by the region 30B (light gray part in the figure) in which the conductor exists to the total surface area of a predetermined region of the insulating substrate 10 formed with the ground layer 30, i.e., the total of the region 30 B in which the conductor exists and the regions 30A from which the conductor has been removed. The predetermined region D for which the remaining ratio of the ground layer 30 is to be controlled is defined by a length LG along the extending direction of the signal line and a predetermined width along the width direction of the signal line. The length LG along the extending direction of the signal line in the present embodiment is defined in accordance with a length of the curved portion having a curvature. The predetermined width is defined by each of the width W31AR and W31AL on the basis of each of the positions Q1 and Q2 at which signal lines are provided.

In the present embodiment, the remaining ratio of the ground layer 30 is calculated based on a circuit width LL to form the sector-shaped grid pattern shown in FIG. 13 and a width LS of the partial regions from which the conductor has been removed. That is, the remaining amount of the ground layer 30 is calculated from the circuit width LL to form the sector-shaped grid pattern, and the removal amount of the ground layer 30 is calculated from the width LS of the partial regions. In the present example, when the distance from the center X of the curved portion (center of curvature) to the center of the signal line L31A (position on Q1 in the figure) or the center of the signal line L31B (position on Q2 in the figure) is represented by a bend radius (curvature radius) R, the center angle to form the region corresponding to the circuit width LL that forms the sector-shaped grid pattern is represented by $\theta_L$, and the center angle to form the region corresponding to the width LS of the partial regions is represented by $\theta_S$, the circuit width LL and the width LS of the partial regions can be calculated as below:

$$LL = R \times \theta_L; \text{ and}$$

$$LS = R \times \theta_S.$$

The remaining amount of the ground layer 30 is calculated from the circuit width LL to form the sector-shaped grid pattern, and the removal amount of the ground layer 30 is calculated from the width LS of the partial regions.

Specifically, in the present embodiment, the remaining ratio of the ground layer 30 can be obtained using Equation 3 below:

$$\text{Remaining ratio } [\%] = \{LL/(LL+LS)\} \times 100 \tag{3}$$

where $LL = R \times \theta_L$ and $LS = R \times \theta_S$.

In the third embodiment, a printed wiring board 1 was manufactured under the same conditions as those in the first and second working examples. Thereafter, the relationship between the transmission speed ratio and the remaining ratio of the ground layer 30 was measured. The printed wiring board 1 is different in that the differential signal lines L100 (first signal lines L110 and second signal lines L120) have a curved area C and the ground layer 30 corresponding to the region D also has a curved area C, but other conditions are common with those in the first and second working examples. The tendency in the relationship between design indices for the mesh structure and the transmission speed ratio was common with those in the first and second working examples shown in FIG. 5 and FIG. 9. It has thus been found that, also in the printed wiring board 1 having the curved area C, similar actions and effects to those in the first and second working examples can be achieved.

Hereinafter, a third working example according to the third embodiment will be described.

For a pair of signal lines L100 for differential signaling, the wiring interval and other factors were adjusted to provide each characteristic impedance of 50Ω and the impedance when performing differential signaling of 90Ω, and a printed wiring board 1 having a form as shown in FIG. 11A to FIG. 13 was manufactured as Working Example 3.

For a pair of signal lines L100 of the printed wiring board 1 according to the present working example shown in FIG. 12 and FIG. 13, the length of the inside signal line L34B was set to $l_1$, and the length of the outside signal line L34A was set to $l_2$. The bending angle corresponding to the curved portions was set to $\theta$. The difference $\delta 1$ between the lengths $l_1$ and $l_2$ and the transmission speed ratio $v/v_0$ corresponding to the difference $\delta$ can be calculated using Equations 4 below:

$$l_1 = \theta R;$$

$$l_2 = \theta\{R+(L+S)\};$$

$$\delta 1 = l_2 - l_1 = \theta(L+S); \text{ and}$$

$$v/v_0 = l_2/l_1 = (R+L+S)/R = 1+(L+S)/R \tag{4}$$

where L is the circuit width, S is the circuit interval, R is the bending radius of the inside wiring, and $\theta$ is the bending angle.

In the present working example, the circuit width L of a straight portion of the signal lines L100 was 0.08 mm, the circuit interval S was 0.1 mm, and the remaining ratio of the ground layer 30 was 100% (no removed regions). The bending radius R (distance from the center X of curvature) of a representative signal line of the signal lines L100 was 5 mm.

Since the speed ratio in the printed wiring board 1 of the present working example can be calculated using Equations 5 below, the remaining ratio of the ground layer 30 corresponding to the first region D1 based on the position of the outside signal line L34A is calculated so that the calculated speed ratio is obtained.

$$v/v_0 = l_2/l_1 = (R+L+S)/R = 1+(0.08+0.1)/5 = 1.036 \quad (5)$$

With reference to the "relationship between the remaining ratio of the ground layer 30 and the transmission speed ratio $v/v_0$" previously shown in FIG. 4 as one example, the remaining ratio of the ground layer 30 for each of the signal lines L100 is calculated on the basis of the transmission speed ratio $v/v_0$ calculated using the above equations.

In the present working example, the remaining ratio of the ground layer 30 corresponding to the second region D2 based on the position of the inside second signal line L34B of the pair of the signal lines 34 was 100%, and the remaining ratio of the ground layer 30 corresponding to the first region D1 based on the position of the outside first signal line L34A was 79.2%. The circuit width L34B of the inside second signal line L34B of the pair of the signal lines 34 was 80 μm, and the circuit width L34A of the outside first signal line L34A was 90 μm. This can suppress the occurrence of a difference in transmission time between the pair of signal lines L34A and L34B. In the present working example, the remaining ratio of the ground layer 30 corresponding to the second region D2 based on the position of the second signal line L34B was 100%, but the present invention is not limited thereto.

For the printed wiring board 1 of Working Example 3 shown in FIG. 11A to FIG. 13, the remaining ratio of the ground layer 30 corresponding to each of the signal lines 31A, 31B to 34A and 34B was calculated. Calculated values are shown in FIG. 14. In the present working example, the remaining ratio of each portion of the ground layer 30 was calculated so that a difference in transmission time would not occur among all of the signal lines 31A, 31B to 34A and 34B.

In the third working example, as shown in FIG. 14, the remaining ratio of the ground layer 30 was sequentially reduced in the order of the signal line L34B (second signal line) provided innermost at the curved portion, the signal line L34A (first signal line) provided outside the signal line L34B, the signal line L33B (second signal line), the signal line L33A (first signal line), the signal line L32B (second signal line), the signal line L32A (first signal line), the signal line L31B (second signal line), and the signal line L31A (first signal line) provided outermost at the curved portion. This allowed the transmission speed to be adjusted in each of the four pairs of the differential signal lines 31 to 34, i.e., each of the eight signal lines 31A and 31B to 34A and 34B, and a difference in transmission time did not occur among all of the four pairs of the differential signal lines 31 to 34. In the third working example, as shown in FIG. 14, the circuit width L of the signal line was sequentially increased from the signal line L34B provided innermost at the curved portion to the signal line L31A provided outermost at the curved portion. This allowed each of the four pairs of the differential signal lines 31 to 34, i.e., each of all of the eight signal lines 31A and 31B to 34A and 34B, to have the same impedance.

Thus, according to the present embodiment, a difference in transmission time can be suppressed from occurring in plural pairs of differential signal lines L100 that perform differential signaling regardless of the relationship between two signal lines L100, i.e., a pair of signal lines, which perform differential signaling. That is, the remaining ratio of the ground layer 30 corresponding to the region D defined based on the first signal line L110 and the second signal line L120 can be sequentially reduced from the inside to the outside of the curved portions thereby to increase the transmission speed in the first signal line L110 provided outside, so that it is possible to suppress the occurrence of a difference in transmission speed due to the difference in physical length between the first signal line L110 and the second signal line L120. Moreover, the width of each first signal line L110 and each second signal line L120 can be increased from the inside to the outside of the curved portions thereby to allow each of the differential signal lines L100 to have the same impedance. This can suppress the occurrence of common-mode noise from each of the differential signal lines L100.

Embodiments heretofore explained are described to facilitate understanding of the present invention and are not described to limit the present invention. Therefore, it is intended that the elements disclosed in the above embodiments include all design changes and equivalents to fall within the technical scope of the present invention.

1 . . . Printed wiring board
10 . . . Insulating substrate
20 . . . Protective layer
30 . . . Ground layer
L100, L110, L120, (L1A, L1B) to (L4A, L4B), L10 to L16, L20 to L26, L31 to L34, (L31A, L31B) to (L34A, L34B) . . . Signal line
C . . . Curved area
D, D1, D2, P11 to P16 . . . First region, Second region

What is claimed is:

1. A printed wiring board comprising:
   an insulating substrate;
   a first signal line that constitutes differential signal lines formed on the insulating substrate and includes a curved portion;
   a second signal line provided along the first signal line and side by side inside the curved portion; and
   a ground layer formed for the first signal line and the second signal line via an insulating material, the ground layer including a first ground layer corresponding to a first region and a second ground layer corresponding to a second region, the first region being defined based on a position of the first signal line and having a first predetermined width, the second region being defined based on a position of the second signal line and having a second predetermined width,
   the first ground layer having a remaining ratio lower than a remaining ratio of the second ground layer,
   the first predetermined width of the first region being three times or more of a circuit width of the first signal line, the second predetermined width of the second region being three times or more of a circuit width of the second signal line.

2. The printed wiring board according to claim 1, wherein the circuit width of the first signal line is larger than the circuit width of the second signal line.

3. The printed wiring board according to claim 1, wherein the first predetermined width of the first region is larger than the second predetermined width of the second region.

4. The printed wiring board according to claim 1, wherein each of the first ground layer and the second ground layer has a mesh structure in which a plurality of partial region are discretely removed so that a remaining region constitutes the mesh structure.

\* \* \* \* \*